US008885417B2

(12) United States Patent
Nagadomi et al.

(10) Patent No.: US 8,885,417 B2
(45) Date of Patent: Nov. 11, 2014

(54) NONVOLATILE SEMICONDUCTOR MEMORY DEVICE

(71) Applicant: Kabushiki Kaisha Toshiba, Minato-ku (JP)

(72) Inventors: Yasushi Nagadomi, Yokohama (JP); Naoya Tokiwa, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/046,477

(22) Filed: Oct. 4, 2013

(65) Prior Publication Data

US 2014/0036600 A1   Feb. 6, 2014

Related U.S. Application Data

(63) Continuation of application No. 13/357,241, filed on Jan. 24, 2012, now Pat. No. 8,582,369.

(30) Foreign Application Priority Data

Feb. 1, 2011   (JP) ................. 2011-020174

(51) Int. Cl.
    *G11C 11/34*  (2006.01)
    *G11C 16/06*  (2006.01)
    *G11C 16/34*  (2006.01)
    *G11C 16/10*  (2006.01)
    *G11C 16/04*  (2006.01)

(52) U.S. Cl.
    CPC ........ *G11C 16/3459* (2013.01); *G11C 16/3454* (2013.01); *G11C 16/10* (2013.01); *G11C 16/0483* (2013.01)
    USPC ............. 365/185.22; 365/185.03; 365/185.24

(58) Field of Classification Search
    USPC .......................... 365/185.22, 185.03, 185.24
    See application file for complete search history.

(56) References Cited

U.S. PATENT DOCUMENTS

| RE42,120 E | 2/2011 | Tanaka et al. |
|---|---|---|
| 8,582,369 B2 * | 11/2013 | Nagadomi et al. ........ 365/185.22 |
| 2007/0121378 A1 | 5/2007 | Shibata et al. |
| 2008/0080239 A1 | 4/2008 | Shibata |
| 2010/0299475 A1 * | 11/2010 | Yano ............................. 711/103 |
| 2011/0157997 A1 | 6/2011 | Kamigaichi et al. |

FOREIGN PATENT DOCUMENTS

JP   2010-161132   7/2010

OTHER PUBLICATIONS

Office Action issued Jun. 3, 2014 in Chinese Patent Application No. 201210021619.1 (with English Translation).

* cited by examiner

*Primary Examiner* — Toan Le
(74) *Attorney, Agent, or Firm* — Oblon, Spivak, McClelland, Maier & Neustadt, L.L.P.

(57) ABSTRACT

In writing, a first write operation to a first memory cell is executed; and a second write operation for providing a first threshold-voltage distribution to a second memory cell adjacent to the first one, is executed. The first threshold voltage distribution is a lowest threshold-voltage distribution among the positive threshold voltage distributions. It is verified whether a desired threshold voltage distribution has been obtained in the first memory cell or not (first write verify operation), moreover, it is verified whether a first threshold voltage distribution or a threshold voltage distribution having a voltage level larger than the first threshold-voltage distribution has been obtained in the second memory cell or not (second write verify operation). A control circuit outputs results of the first write verify operation and the second write verify operation.

14 Claims, 14 Drawing Sheets

NONVOLATILE SEMICONDUCTOR MEMORY DEVICE

CROSS REFERENCE TO RELATED APPLICATIONS

This application is a continuation of U.S. application Ser. No. 13/357,241 filed Jan. 24, 2012, and is based on and claims the benefit of priority from prior Japanese Patent Application No. 2011-20174, filed on Feb. 1, 2011, the entire contents of each of which are incorporated herein by reference.

FIELD

The embodiments described herein relate to a nonvolatile semiconductor memory device.

BACKGROUND

In recent years, several nonvolatile semiconductor memory devices having memory cells disposed three-dimensionally (stacking type nonvolatile semiconductor memory devices) have been proposed to increase a degree of integration of memory.

DETAILED DESCRIPTION

A nonvolatile semiconductor memory device in an embodiment described below comprises: a memory cell array including a plurality of memory cells; and a control circuit for controlling a voltage applied to the plurality of memory cells.

Moreover, the control circuit is configured to provide to the memory cells a threshold voltage distribution which is at least partly negative by applying a voltage to the memory cells to store holes in the charge storage film and thereby erase retained data of the memory cells, and to provide to the memory cells plural types of positive threshold voltage distributions by applying a voltage to the memory cells to store electrons in the charge storage film and thereby write plural types of data to the memory cells.

In addition, the control circuit is configured to, in a write operation on the memory cells, execute: a first write operation for providing the plural types of positive threshold voltage distributions to a write-object first memory cell; a first write verify operation for verifying whether the plural types of positive threshold voltage distributions have been obtained in the first memory cell or not; a second write operation for providing a first threshold voltage distribution to a second memory cell adjacent to the first memory cell, the first threshold voltage distribution being a lowest threshold voltage distribution among the plural types of positive threshold voltage distributions; and a second write verify operation for verifying whether the first threshold voltage distribution or a threshold voltage distribution having a voltage level larger than the first threshold voltage distribution has been obtained in the second memory cell or not, and output results of the first write verify operation and the second write verify operation.

Embodiments of a nonvolatile semiconductor memory device according to the present invention are described below with reference to the drawings.

[First Embodiment]
[Configuration]

Figure 1:
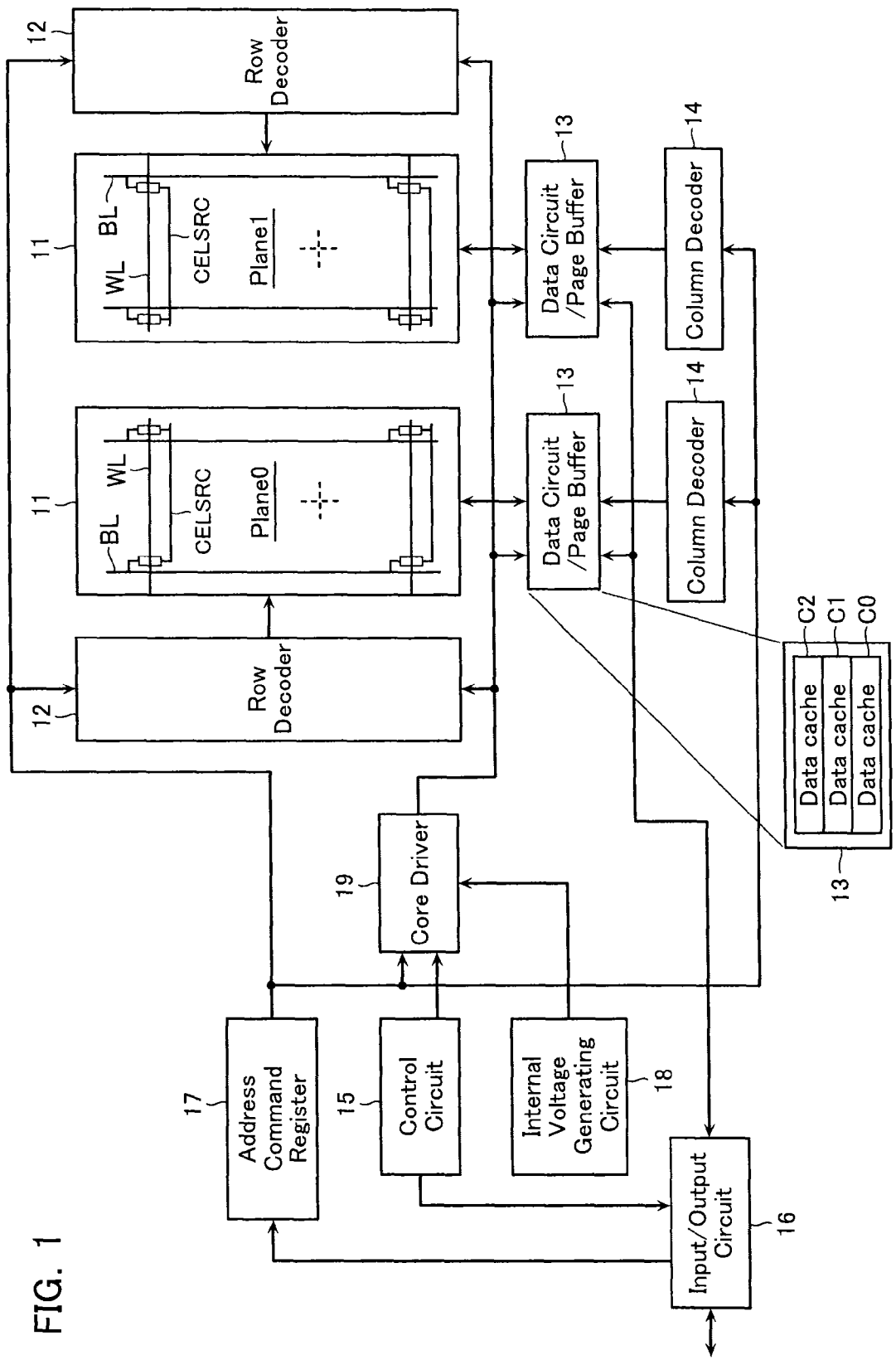
FIG. 1 describes an overall configuration of a nonvolatile semiconductor memory device according to a first embodiment.

First, an overall configuration of a nonvolatile semiconductor memory device according to a first embodiment is described with reference to FIG. 1. FIG. 1 is a block diagram of the nonvolatile semiconductor memory device according to the first embodiment of the present invention.

As shown in FIG. 1, the nonvolatile semiconductor memory device according to the first embodiment comprises a memory cell array 11, a row decoder 12, a data circuit/page buffer 13, a column decoder 14, a control circuit 15, an input/output circuit 16, an address command register 17, an internal voltage generating circuit 18, a core driver 19, and a status register 20.

Figure 2:
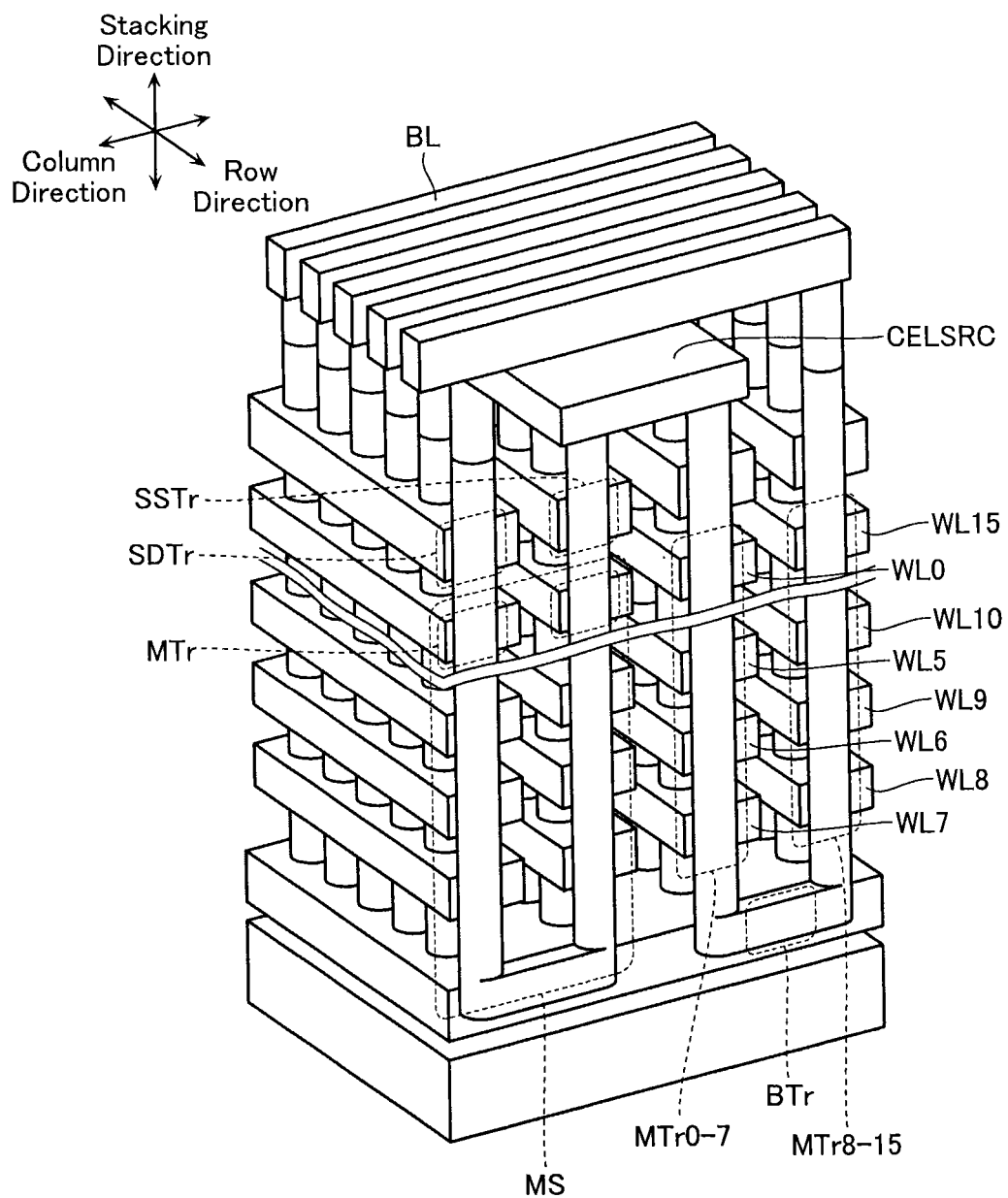
FIG. 2 is a schematic perspective view of part of a memory cell array 11 shown in FIG. 1.

As shown in FIG. 2, the memory cell array 11 includes a plurality of bit lines BL extending in a column direction, a plurality of source lines CELSRC extending in a row direction intersecting the bit lines BL, and a memory string MS in which a plurality of electrically rewritable memory cells MTr are connected in series. Although the present embodiment is described as having two memory cell arrays 11 in a memory cell chip, the technology described in the present embodiment is not limited to the case of two memory cell arrays 11, and may be applied also to a device in which only one memory cell array 11 (plane) exists in the memory chip, or a device in which three or more memory cell arrays 11 exist in the memory chip.

As shown in FIG. 2, the memory cell array 11 is configured having the electrically data storing memory cells MTr arranged in a three-dimensional matrix. That is, the memory cells MTr, in addition to being arranged in a matrix in a stacking direction, are also arranged in a matrix in a horizontal direction orthogonal to the stacking direction. A plurality of the memory cells MTr aligned in the stacking direction are connected in series to configure a memory string MS. Note that shown here is an example where one memory cell array is divided into a plurality of planes Plane0 and Plane2.

Connected to the two ends of the memory string MS are a drain side select transistor SDTr and a source side select transistor SSTr that are set to a conductive state when selected. This memory string MS is arranged having the stacking direction as a long direction. The drain side select transistor SDTr has one end connected to the bit line BL. The source side select transistor SSTr has one end connected to the source line CELSRC.

As shown in FIG. 1, the row decoder 12 decodes a block address signal and so on inputted from the address command register 17, and, in addition, receives a word line control signal or select gate control signal outputted from the core driver 19, to control the memory cell array 11.

During a read operation, the data circuit/page buffer 13 reads data from the memory cell array 11 and retains the data temporarily in a page buffer. In addition, during a write operation, the data circuit/page buffer 13, after write data is loaded into the page buffer from chip external, writes the data to a selected memory cell by cooperation of the page buffer and a data circuit.

In the present embodiment, the data circuit/page buffer 13 comprises three cache memories C0-C2 for retaining three pages worth of write data, or verify read data.

The column decoder 14 decodes a column address signal inputted from the address command register 17 to perform input/output control of data. The control circuit 15 receives from the address command register 17 signals for executing read/write/erase operations, and, in accordance with a certain sequence, controls the internal voltage generating circuit 18 that generates various voltages required in core operations, and, in addition, controls the core driver 19 that performs control of the word lines or bit lines. The input/output circuit 16 performs input/output control of command address data. The status register 20 includes a function of temporarily retaining, in addition to a ready/busy signal (R/B), status signals indicating a progress state of the various operations, and of outputting these signals to external.

Figure 3:
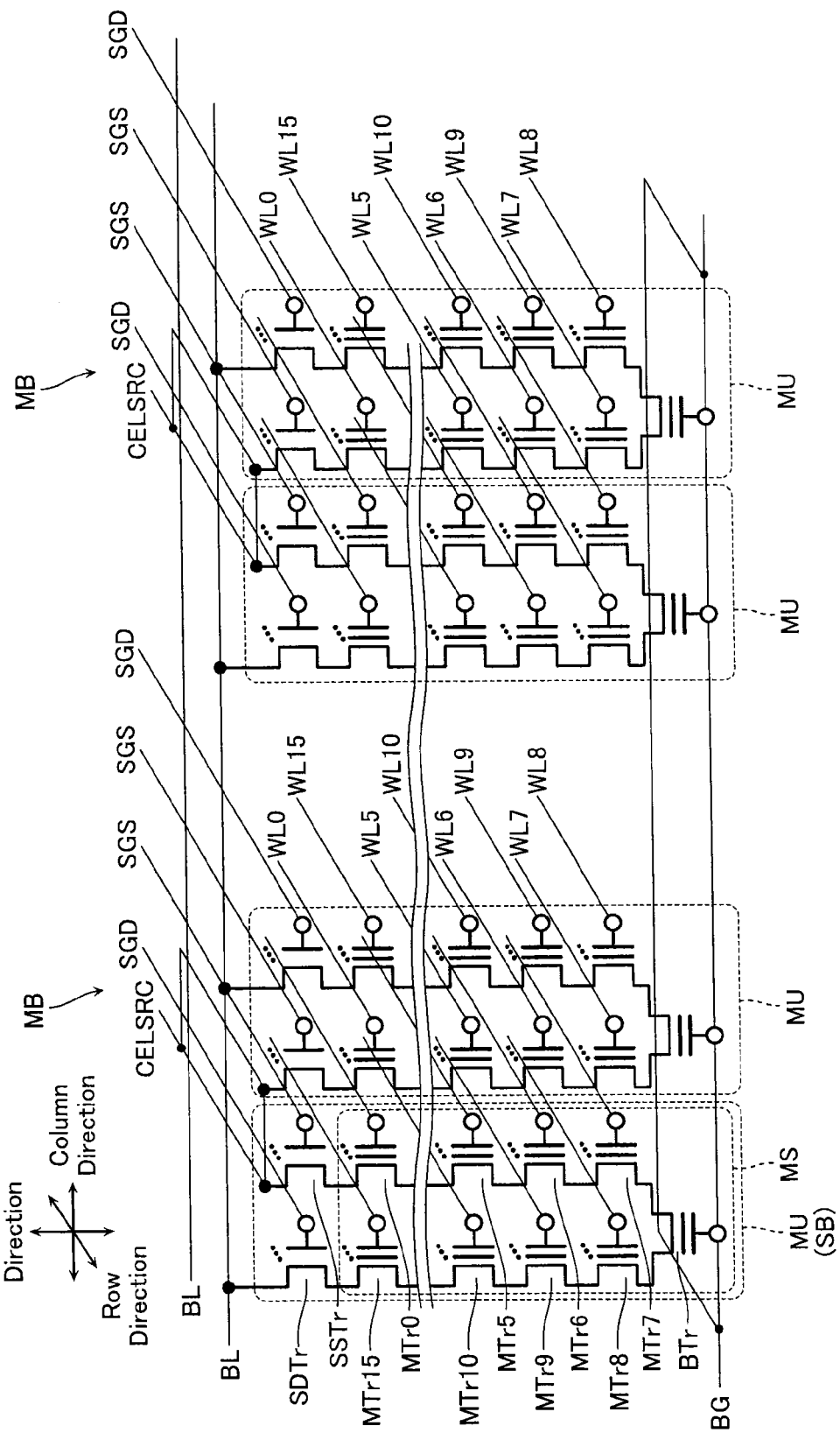
FIG. 3 is an equivalent circuit diagram of the memory cell array 11.

Next, a circuit configuration of the memory cell array 11 is described with reference to FIG. 3. FIG. 3 is an equivalent circuit diagram of the memory cells MTr formed along a cross-section in the column direction of the memory cell array 11, the drain side select transistor, SDTr, the source side select transistor, SSTr, and peripheral circuits of the memory cell array 11.

As shown in FIG. 3, the memory cell array 11 includes the plurality of bit lines BL, and a plurality of memory blocks MB. The bit lines BL extend in stripes straddling the plurality of memory blocks MB in the column direction and having a certain pitch in the row direction. The memory blocks MB are provided repeatedly in the column direction with a certain pitch.

As shown in FIG. 3, the memory block MB includes a plurality of memory units MU arranged in a matrix in the row direction and the column direction orthogonal to the row direction. One bit line BL is provided with a plurality of memory units MU connected commonly thereto.

The memory unit MU includes the memory string MS, the source side select transistor SSTr, and the drain side select transistor SDTr. Memory units MU adjacent in the column direction are formed having their configurations symmetrical to one another in the column direction. The memory units MU are arranged in a matrix in the row direction and the column direction. A plurality of memory units MU arranged in one line in the row direction configure one sub-block SB.

The memory string MS is configured by memory cells MTr0-MTr15 connected in series, and a back gate transistor BTr. The memory cells MTr0-MTr7 are connected in series in the stacking direction. The memory cells MTr8-MTr15 are also similarly connected in series in the stacking direction. The memory cells MTr0-MTr15 store information by storing a charge in a charge storage film.

The back gate transistor BTr is connected between the memory cell MTr7 and the memory cell MTr8 in a lowermost layer. Therefore, the memory cells MTr0-MTr15 and the back gate transistor BTr are connected in a U shape in the cross-section along the column direction. The source side select transistor SSTr has its drain connected to one end of the memory string MS (source of the memory cell MTr0). The drain side select transistor SDTr has its source connected to the other end of the memory string MS (drain of the memory cell MTr15).

Gates of the memory cells MTr0 in memory units MU in one memory block MB are commonly connected to the word line WL0. Similarly, respective gates of the memory cells MTr1-MTr15 in memory units MU in one memory block MB are commonly connected to the corresponding word lines WL1-WL15. Moreover, gates of the back gate transistors BTr arranged in a matrix in the row direction and the column direction are commonly connected to a back gate line BG.

In the memory units MU, gates of the drain side select transistors SDTr arranged in a line in the row direction are commonly connected to a drain side select gate line SGD extending in the row direction, respectively. Moreover, drains of the drain side select transistors SDTr arranged in a line in the column direction are commonly connected to the bit line BL.

In the memory units MU, gates of the source side select transistors SSTr arranged in a line in the row direction are commonly connected to a source side select gate line SGS extending in the row direction, respectively. Moreover, in a pair of the memory units MU adjacent in the column direction, sources of the source side select transistors SSTr arranged in a line in the row direction are commonly connected to the source line CELSRC extending in the row direction.

Figure 4:
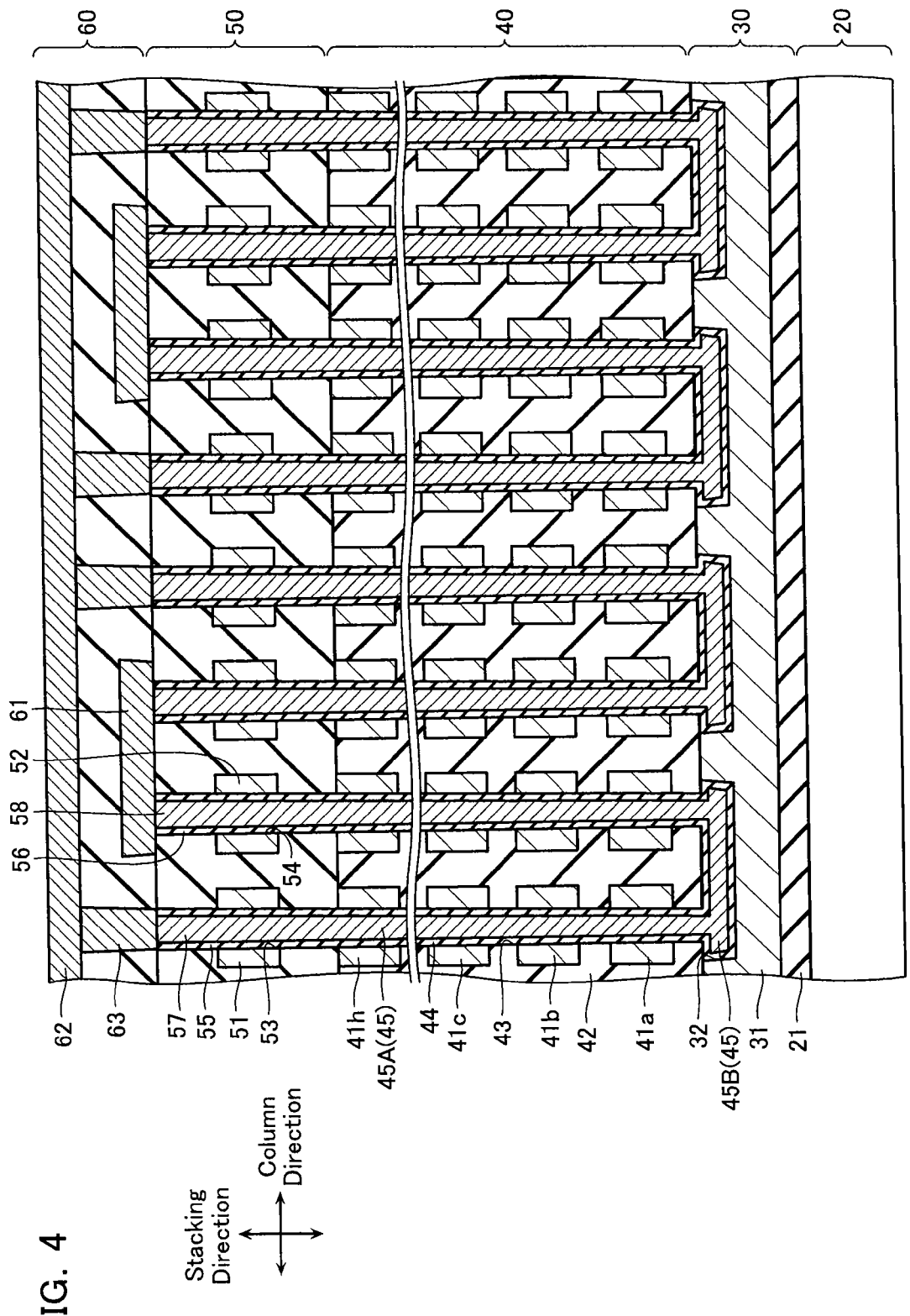
FIG. 4 describes a stacking structure of the memory cell array 11 for realizing the circuit configuration shown in FIG. 3.
Figure 5:
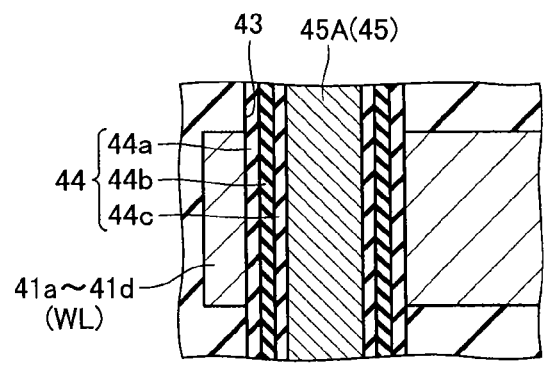
FIG. 5 is an enlarged view of part of FIG. 4.

Next, a stacking structure of the memory cell array 11 for realizing the circuit configuration shown in FIG. 3 is described with reference to FIG. 4. FIG. 4 is a cross-sectional view of the memory cell array 11 according to the first embodiment, and FIG. 5 is an enlarged view of part of FIG. 4.

As shown in FIG. 4, the memory cell array 11 includes a substrate 20, and, sequentially from a lower layer, a back gate layer 30, a memory cell layer 40, a select transistor layer 50, and a wiring layer 60. The back gate layer 30 functions as the back gate transistor BTr. The memory cell layer 40 functions as the memory cells MTr0-MTr15. The select transistor layer 50 functions as the drain side select transistor SDTr and the source side select transistor SSTr. The wiring layer 60 functions as the source line CELSRC and the bit line BL.

As shown in FIG. 4, the back gate layer 30 includes a back gate conductive layer 31 formed on the substrate 20 via an insulating layer 21. The back gate conductive layer 31 functions as the back gate line BG and as the gate of the back gate transistor BTr. The back gate conductive layer 31 is formed in a plate shape extending in the row direction and the column direction. The back gate conductive layer 31 is formed covering a lower surface and side surfaces of a joining portion 45B of a U-shaped semiconductor layer 45 to be described later. The back gate conductive layer 31 is configured by polysilicon (poly-Si).

In addition, as shown in FIG. 4, the back gate layer 30 includes a back gate trenches 32 formed so as to dig out the back gate conductive layer 31. The back gate trenches 32 are formed as an opening having a short direction in the row direction and a long direction in the column direction. The back gate trenches 32 are formed in a matrix at certain intervals in the row direction and the column direction.

As shown in FIG. 4, the memory cell layer 40 includes word line conductive layers 41a-41h formed in the stacking direction via insulating layers 42. The word line conductive layers 41a-41h function as word lines WL0-WL15 and as control gates of the memory cells MTr0-MTr15. The word line conductive layers 41a-41h are divided on a memory block MB basis and formed in a pair of comb-tooth shapes facing each other in the row direction. Each word line conductive layer formed in the comb-tooth shape in identical layers is connected to an independent contact.

Note that the word line conductive layers 41a-41h may also be connected to an independent contact on a single memory unit basis, to enable the word lines WL to be independently driven on a memory unit MU basis.

The word line conductive layers 41a-41h include a portion formed in stripes extending in the row direction and having a certain pitch in the column direction. The word line conductive layers 41a-41h are configured by polysilicon (poly-Si) or polycide.

In addition, as shown in FIG. 4, the memory cell layer 40 includes a memory hole 43 formed penetrating the word line conductive layers 41a-41h and the insulating layers 42. The memory hole 43 is formed aligning with a position of the two end vicinities in the column direction of each back gate trench 32. The memory hole 43 is formed in a matrix in the row direction and the column direction.

Moreover, as shown in FIG. 4, the above-described back gate transistor layer 30 and the memory cell layer 40 include a memory gate insulating layer 44 and the U-shaped semiconductor layer 45. The U-shaped semiconductor layer 45 functions as a body of the memory cells MTr0-MTr15 and the back gate transistor BTr.

As shown in FIG. 4, the memory gate insulating layer 44 is formed continuously on a side surface of the memory hole 43 and an inner surface of the back gate trench 32 (side surfaces and lower surface). As shown in FIG. 5, the memory gate insulating layer 44 includes a block insulating layer 44a, a charge storage layer 44b, and a tunnel insulating layer 44c. The block insulating layer 44a is formed along the memory hole 43 side surface and the back gate trench 32 inner surface, and the block insulating layer 44a is formed in contact with the word line conductive layers 41a-41h and the back gate conductive layer 31. The block insulating layer 44a is configured by silicon oxide ($SiO_2$). The charge storage layer 44b is formed on the block insulating layer 44a. The charge storage layer 44b stores a charge and is employed to retain data of the memory cells MTr0-MTr15. The charge storage layer 44b is configured by silicon nitride (SiN). The tunnel insulating layer 44c is formed on the charge storage layer 44b. The tunnel insulating layer 44c is configured by silicon oxide ($SiO_2$).

As shown in FIG. 4, the U-shaped semiconductor layer 45 is formed in a U shape as viewed from the row direction. As shown in FIG. 5, the U-shaped semiconductor layer 45 is formed in contact with the tunnel insulating layer 44c and filling the back gate trench 32 and the memory hole 43. The U-shaped semiconductor layer 45 includes a pair of columnar portions 45A extending in a perpendicular direction to the substrate 20 as viewed from the row direction, and the joining portion 45B formed joining lower ends of the pair of columnar portions 45A. The U-shaped semiconductor layer 45 is configured by polysilicon (poly-Si).

Expressing the above-described configuration of the memory cell layer 40 in other words, the tunnel insulating layer 44c is formed surrounding a side surface of the columnar portion 45A. The charge storage layer 44b is formed surrounding a side surface of the tunnel insulating layer 44c. The block insulating layer 44a is formed surrounding a side surface of the charge storage layer 44b. The word line conductive layers 41a-41h are formed surrounding a side surface of the block insulating layer 44a. Note that the charge storage layer 44b is formed not only on a side surface of the word line conductive layers 41a-41h, but also on a side surface of the interlayer insulating film between these word line conductive layers 41a-41h, that is, the charge storage layer 44b is formed continuously in an up-and-down direction on the side surface of the columnar portion 45A.

As shown in FIG. 4, the select transistor layer 50 includes a drain side conductive layer 51 and a source side conductive layer 52 formed in the same layer as the drain side conductive layer 51. The drain side conductive layer 51 functions as the drain side select gate line SGD and as a gate electrode of the drain side select transistor SDTr. The source side conductive layer 52 functions as the source side select gate line SGS and as a gate electrode of the source side select transistor SSTr.

The drain side conductive layer 51 and the source side conductive layer 52 extend in stripes in the row direction having a certain pitch in the column direction. The drain side conductive layer 51 and the source side conductive layer 52 are provided alternately two at a time in the column direction. The drain side conductive layer 51 and the source side conductive layer 52 are configured by polysilicon (poly-Si).

In addition, as shown in FIG. 4, the select transistor layer 50 includes a drain side hole 53 and a source side hole 54. The drain side hole 53 is formed penetrating the drain side conductive layer 51. The source side hole 54 is formed penetrating the source side conductive layer 52. The drain side hole 53 and the source side hole 54 are formed at a position aligning with the memory hole 43.

Moreover, as shown in FIG. 4, the select transistor layer 50 includes a drain side gate insulating layer 55, a source side gate insulating layer 56, a drain side columnar semiconductor layer 57, and a source side columnar semiconductor layer 58. The drain side columnar semiconductor layer 57 functions as a body of the drain side select transistor SDTr. The source side columnar semiconductor layer 58 functions as a body of the source side select transistor SSTr.

The drain side gate insulating layer 55 is formed on a side surface of the drain side hole 53. The source side gate insulating layer 56 is formed on a side surface of the source side hole 54. The drain side gate insulating layer 55 and the source side gate insulating layer 56 are configured by silicon oxide ($SiO_2$).

The drain side columnar semiconductor layer 57 is formed in a column shape extending in the stacking direction, in contact with the drain side gate insulating layer 55, so as to fill the drain side hole 53. The source side columnar semiconductor layer 58 is formed in a column shape extending in the stacking direction, in contact with the source side gate insulating layer 56, so as to fill the source side hole 54. The drain side columnar semiconductor layer 57 and the source side columnar semiconductor layer 58 are configured by polysilicon (poly-Si).

Expressing the above-described configuration of the select transistor layer 50 in other words, the drain side gate insulating layer 55 is formed surrounding a side surface of the drain side columnar semiconductor layer 57. The drain side conductive layer 51 is formed surrounding a side surface of the drain side gate insulating layer 55. The source side gate insulating layer 56 is formed surrounding a side surface of the source side columnar semiconductor layer 58. The source side conductive layer 52 is formed surrounding a side surface of the source side gate insulating layer 56.

As shown in FIG. 4, the wiring layer 60 includes a first wiring layer 61, a second wiring layer 62, and a plug layer 63. The first wiring layer 61 functions as the source line CELSRC. The second wiring layer 62 functions as the bit line BL.

As shown in FIG. 4, the first wiring layer 61 is formed to be commonly in contact with upper surfaces of two adjacent source side columnar semiconductor layers 58. The first wiring layer 61 extends in stripes in the row direction having a certain pitch in the column direction. The first wiring layer 61 is configured by a metal such as tungsten (W).

As shown in FIG. 4, the second wiring layer 62 is connected to an upper surface of the drain side columnar semiconductor layer 57 via the plug layer 63. The second wiring layer 62 extends in stripes in the column direction having a certain pitch in the row direction. The second wiring layer 62 is configured by a metal such as copper (Cu), and the plug layer 63 is configured by a metal such as tungsten (W).

[Method of Write of Data]

Next, a method of data write in this nonvolatile semiconductor memory device is described with reference to FIG. 6. For convenience of explanation, an example is described where an erase operation is performed on a memory cell capable of retaining two bits of data (two bits per cell system) before the data write is performed.

Note that the embodiment described below may be applied also to the case where multiple bits of three or more bits of data are retained in one memory cell, and that the embodiment described below may be applied also to the case where one bit of data is retained in one memory cell.

Figure 6:
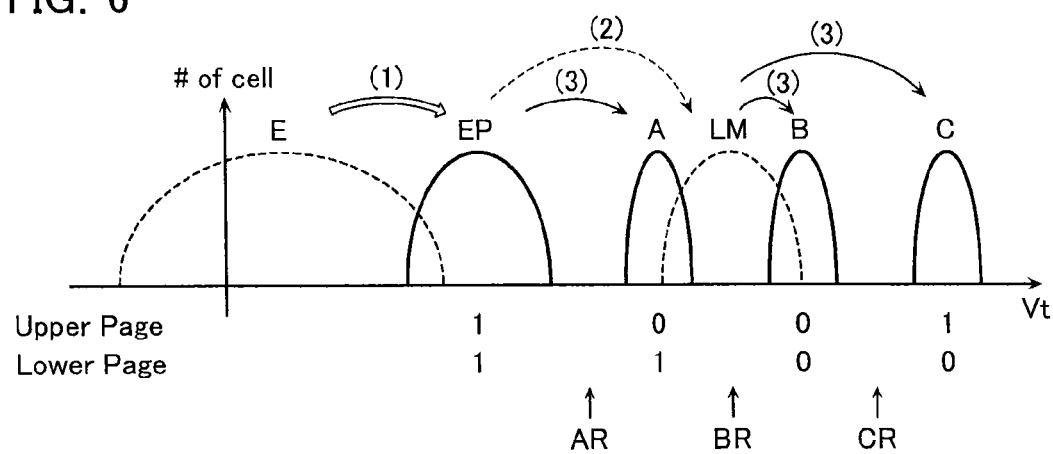
FIG. 6 is a schematic view explaining one example of a procedure of a write system (two bits per cell system) for storing two bits of data in one memory cell MC.

When an erase operation is performed on a memory cell MC before performing data write, the threshold voltage distribution of the memory cell becomes a threshold voltage distribution E shown in FIG. 6. The threshold voltage distribution E herein is set such that at least apart of a lower limit side is a negative voltage value. Note that employing a negative voltage as an erase verify voltage allows an upper limit of the threshold voltage distribution E also to be configured to be a negative value.

A write operation of two bits of data to a memory cell MC having the threshold voltage distribution E is performed by providing to the memory cell MC any one of the four threshold voltage distributions EP, A, B, and C (EP<A<B<C) shown in FIG. 6, in accordance with the two bits of data to be written to the memory cell. The threshold voltage distribution EP is the lowest distribution of the four threshold voltage distributions, with voltage levels increasing thereafter in the order of A, B, and C. Moreover, the two bits of data are provided divided into lower page data and upper page data.

In the example of FIG. 6, when lower page data and upper page data are both "1", the memory cell MC is provided with the threshold voltage distribution EP. In addition, when lower page data and upper page data are respectively "1" and "0", the memory cell MC is provided with the threshold voltage distribution A. When lower page data and upper page data are both "0", the memory cell MC is provided with the threshold voltage distribution B. When lower page data and upper page data are respectively "0" and "1", the memory cell MC is provided with the threshold voltage distribution C. Note that this is purely one example, and it goes without saying that data allocation to the threshold voltage distributions is not limited to that shown in FIG. 6.

In this method of write in FIG. 6, the lower page data and the upper page data are provided separately, and write based on the lower page data (lower page write) and write based on the upper page data (upper page write) are executed separately.

Furthermore, in this method of write in FIG. 6, before execution of lower page write and upper page write on one memory cell MC(n) (first write operation), a write operation to raise the threshold voltage distribution of the memory cell MC(n) from the threshold voltage distribution E to the threshold voltage distribution EP (EP distribution write (second write operation)) is executed. The threshold voltage distribution EP is a distribution allocated with the same data "11" as the threshold voltage distribution E subsequent to erase, and is a distribution having a smallest (lowest) voltage level among the four threshold voltage distributions. Note that the EP distribution write is executed on a memory cell (for example MCn+1) adjacent to a memory cell on which an ordinary write operation (lower page data write, upper page data write, or both) has been performed (for example MC(n)).

In addition, it is desirable that data indicating whether execution of EP distribution write along a certain word line WL has been completed or not is stored in the memory cell array. The control circuit 15 can store EP flag data indicating to the fact in part of the memory cell array, for example, in one of the memory cells MC along one word line WL.

After completion of this EP distribution write ((1) in FIG. 6), lower page write (2) and upper page write (3) are executed.

As shown in FIG. 6, the lower page write (2) is executed on a memory cell MC having the threshold voltage distribution EP subsequent to EP distribution write. If lower page data is "1", the threshold voltage distribution EP of the relevant memory cell is maintained unchanged, and if lower page data is "0", a write operation and write verify operation to provide an intermediate distribution LM are performed. In other words, the intermediate distribution LM is a threshold voltage distribution corresponding to lower page data "0".

Note that voltages applied to each of the memory cells in the write operation and the write verify operation are similar to conventionally applied voltages, hence details of these voltages are omitted. The intermediate distribution LM is, for example, a threshold voltage distribution in a voltage range approximately between those of the threshold voltage distributions A and B, and does not remain in the memory cell MC after upper page write has been performed.

The upper page write is performed based on upper page data provided from external to the cache memories C0 or C1 in the page buffer 13, and on lower page data transferred to the cache memory C2. In the case of the system in FIG. 6, if lower page data and upper page data are both "1", the relevant memory cell MC is maintained unchanged at the threshold voltage distribution EP. On the other hand, if lower page data and upper page data are respectively "1" and "0", the relevant memory cell MC is subjected to a write operation to change its threshold voltage distribution from the threshold voltage distribution EP to the threshold voltage distribution A.

In addition, when lower page data and upper page data are both "0", the relevant memory cell MC is already provided with the intermediate distribution LM by the lower page write, hence undergoes a further write operation to have its threshold voltage distribution changed from the intermediate distribution LM to the threshold voltage distribution B.

On the other hand, when lower page data and upper page data are respectively "0" and "1", the relevant memory cell MC is already provided with the intermediate distribution LM by the lower page write, hence undergoes a further write operation to have its threshold voltage distribution changed from the intermediate distribution LM to the threshold voltage distribution C.

Note that, in a read operation of the memory cell MC (n) after it has undergone this kind of write operation, read voltages AR (between an upper limit of the threshold voltage distribution EP and a lower limit of the threshold voltage distribution A), BR (between an upper limit of the threshold voltage distribution A and a lower limit of the threshold voltage distribution B), and CR (between an upper limit of the threshold voltage distribution B and a lower limit of the threshold voltage distribution C) are applied to the control gate of a selected memory cell MC in one memory string, similarly to conventionally. On the other hand, the control gate of an unselected memory cell MC is applied with a read pass voltage larger than an upper limit of the threshold voltage distribution CR.

In a state where both write of lower page data and write of upper page data have been completed and the threshold voltage distributions EP, A, B, and C have been obtained, read of lower page data can be performed by one time of the read operation using the voltage BR. On the other hand, in a state where only lower page data write has been completed and write of upper page data has not yet been completed so that the memory cell MC has either of the threshold voltage distributions LM or EP, two times of the read operation using the two voltages AR and BR become necessary to perform lower page data read. Note that LM flag data may be stored in for example a part of the memory cell array, to indicate whether execution of the write operation of such lower page data (write operation of the intermediate distribution LM) has been completed or not. This LM flag data may be appropriately referred to in the write operation and read operation of data.

In this method of write shown in FIG. 6, a write operation of the intermediate distribution LM is performed in the lower page data write. Ultimately, the intermediate distribution LM does not remain as a distribution indicating data, hence a distribution width of the intermediate distribution LM can be made broader compared with those of the other threshold voltage distributions EP, A, B, and C. As a result, time required for write of lower page data can be reduced and time required for the write operation overall can be shortened compared to when the threshold voltage distributions EP, A, B, and C are written directly.

[Another Method of Data Write]

Figure 7:
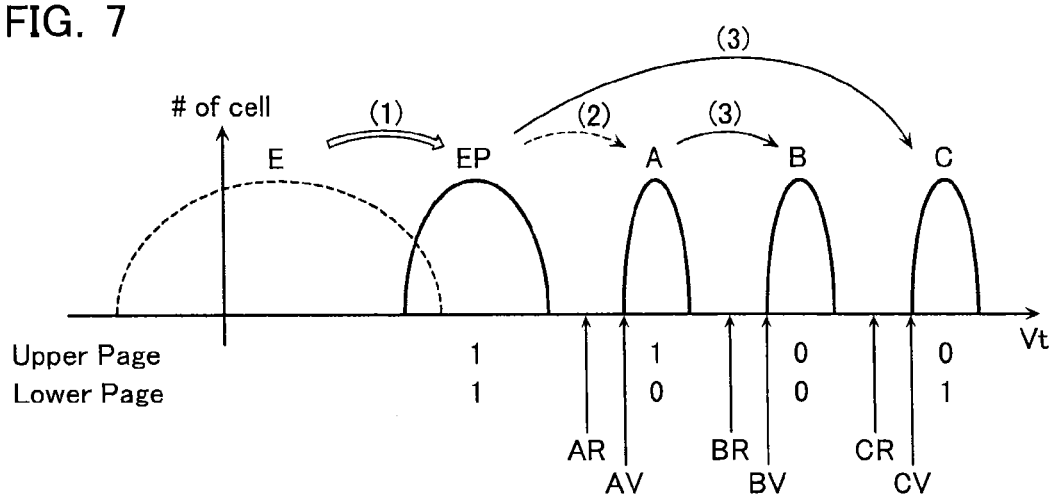
FIG. 7 is a schematic view explaining another example of a procedure of a two bits per cell write system.

Next, another method of data write in this nonvolatile semiconductor memory device is described with reference to FIG. 7. Similarly to FIG. 6, this FIG. 7 also describes an example where an erase operation is performed on a memory cell capable of retaining two bits of data (two bits per cell system) before the data write is performed. When the erase operation is performed, the threshold voltage distribution of the memory cell becomes the threshold voltage distribution E having at least a part that is negative as shown in FIG. 7. However, in this method of write, the write operation to provide the final threshold voltage distributions EP, A, B, and C is executed directly, without performing the write operation to provide the intermediate distribution LM as in FIG. 6.

Likewise in the write operation in FIG. 7, the EP distribution write (1) is executed before execution of the lower page write (2) and the upper page write (3) on the one memory cell MC(n). In the lower page write (2) executed after the EP distribution write (1), the threshold voltage distribution A is provided to the memory cell MC having the threshold voltage distribution EP (or E), according to lower page data. Specifically, if lower page data is "1", the threshold voltage distribution EP (or E) of the relevant memory cell MC is maintained unchanged, and if "0", a write operation and write verify operation to provide the threshold voltage distribution A are performed.

The upper page write (3) is performed based on upper page data provided from external to the cache memories C0 or C1 in the page buffer 13, and on lower page data transferred to the cache memory C2. In the case of the system in FIG. 7, if lower page data and upper page data are both "1", the relevant memory cell MC is maintained unchanged at the threshold voltage distribution EP (or E). On the other hand, if lower page data and upper page data are respectively "1" and "0", the relevant memory cell MC is subjected to a write operation to change its threshold voltage distribution from the threshold voltage distribution EP (or E) to the threshold voltage distribution C.

In addition, when lower page data and upper page data are both "0", the relevant memory cell MC is already provided with the threshold voltage distribution A by the lower page write, hence undergoes a further write operation to have its threshold voltage distribution changed from the threshold voltage distribution A to the threshold voltage distribution B.

On the other hand, when lower page data and upper page data are respectively "0" and "1", the relevant memory cell MC is already provided with the threshold voltage distribution A by the lower page write, hence has its threshold voltage distribution maintained unchanged at the threshold voltage distribution A.

That concludes description of two examples of two bits per cell write systems. However, it goes without saying that systems other than these above-described two systems may be adopted.

Thus, in the present embodiment, whether the write system in FIG. 6, the write system in FIG. 7, or some other write system is adopted, an EP distribution write operation to change the threshold voltage distribution from the threshold voltage distribution E subsequent to the erase operation to the threshold voltage distribution EP is executed, prior to an ordinary data write operation. This EP distribution write operation is executed on at least the memory cell MC(n+1) adjacent to the memory cell MC(n) subject to the ordinary write operation. The reason for this is described with reference to FIG. 8.

Figure 8:
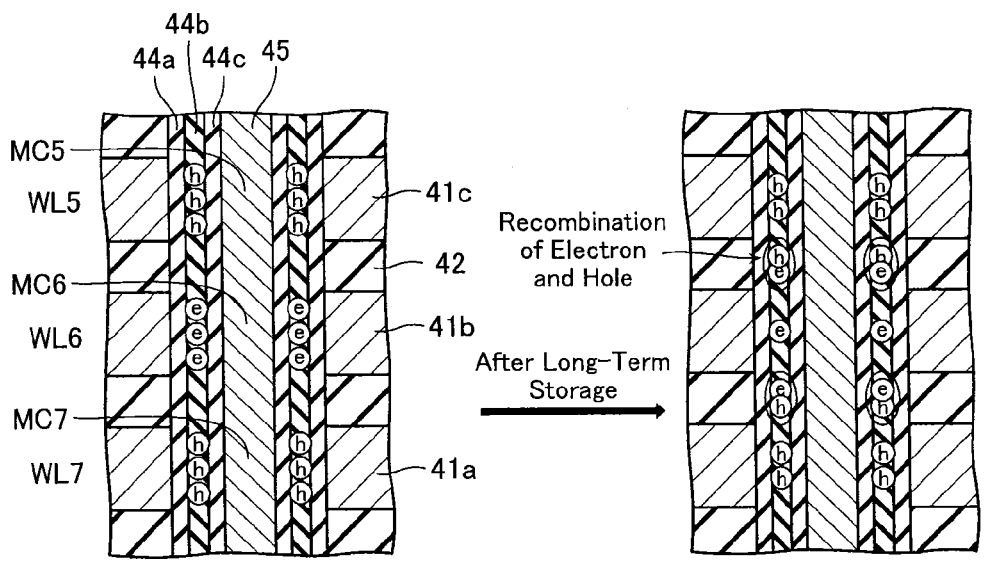
FIG. 8 explains problems of leaving memory cells MC (n+1) and MC (n−1) adjacent to write target memory cell MC(n) retaining a threshold voltage distribution E.

Usually, a write operation to a NAND type flash memory is commenced from a memory cell MC1 on a side close to the source line CELSRC and thereafter advanced in a direction of increasing separation from the source line CELSRC. It is assumed that, at this time, as shown in FIG. 8, the write operation to provide one of the threshold voltage distributions EP, A, B, and C is executed on for example the memory cell MC6 along the word line WL6, while the adjacent memory cells MC5 and MC7 are maintained at the threshold voltage distribution E having at least a part that is negative, without undergoing execution of the write operation.

At this time, electrons are trapped in the charge storage film 44b of the memory cell MC6, while holes are trapped in the memory cells MC5 and MC7. In a nonvolatile semiconductor memory device having a structure where the charge storage film 44b in one memory string MS is continuous without being divided even between memory cells MC (at a side portion of the interlayer insulating film 42), there is a risk that, when a long period of time passes after the data write operation, the holes and electrons migrate giving rise to recombination of the holes and electrons, whereby a change occurs in data retained in the memory cells. Consequently, regarding at least a memory cell MC(n+1) that is adjacent to a memory cell MC(n) in which some kind of data write has been completed, it is undesirable that such a memory cell MC(n+1) be left unchanged retaining the threshold voltage distribution E without undergoing execution of a write operation.

Figure 9:
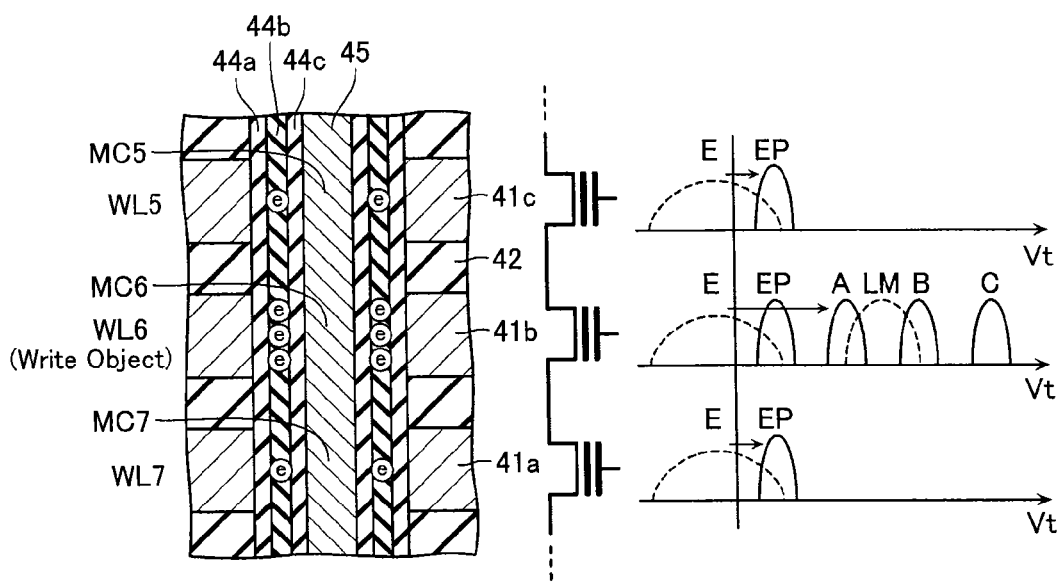
FIG. 9 is a schematic view explaining operation of the present embodiment.

Accordingly, in the present embodiment, as shown in FIG. 9, when the write-object memory cell MC6 undergoes execution of a write operation to provide it with the threshold voltage distributions EP, A, B, or C, or the intermediate distribution LM, the memory cells MC5 and MC7 adjacent to this memory cell MC6 also undergo execution of the EP distribution write operation to change their threshold voltage distribution from E to EP so as not to be left unchanged at the threshold voltage distribution E, irrespective of what kind of data is to be written to these memory cells MC5 and MC7 (even if that data is "11"). Performing this EP distribution write operation causes a small amount of electrons (e) to be stored in the charge storage film 44b of the memory cells MC(n−1) and MC(n+1) in place of the holes (h). As a result, electrons (e) are trapped in the charge storage film of the memory cells MC5-MC7. This allows the risk that a change in data occurs due to recombination of holes and electrons to be suppressed.

Incidentally, when a write operation is executed on a memory cell MC (n), a write verify operation to verify whether a desired threshold voltage distribution has been achieved or not is executed. That is, a write operation to a memory cell MC(n) is generally performed by the following kind of procedure, for example.

(1) The control gate of the memory cell MC (n) is applied with a certain program voltage Vpgm (for example, about 20 V) as a pulse voltage, while a channel of the memory cell MC (n) is provided with 0 V via the bit line BL and the drain side select transistor SDTr (write pulse application operation). This causes electrons to be stored in the charge storage film of the memory cell MC (n), and the threshold voltage of the memory cell MC(n) to be raised.

(2) The control gate of the memory cell MC(n) is provided with the verify voltages AV, BV, and CV that are larger than the read voltages AR, BR, and CR (refer to FIG. 6), while the memory cells MC in the memory string MS are provided with a read pulse voltage Vread to verify whether a current flows in the memory string MS or not (write verify operation). If a current flows, this indicates that the threshold voltage of the memory cell MC(n) has attained the desired threshold voltage distribution. If a current does not flow, the write pulse application operation in (1) is re-executed.

Thus, in a conventional nonvolatile semiconductor memory device, when the write verify operation is used to verify whether the desired threshold voltage distribution has been provided to the write-target memory cell MC(n) or not, and a positive result is obtained, a desired write operation on the memory cell MC(n) is judged to have been completed.

In contrast, in the present embodiment, not only is a write verify operation on the write-target memory cell MC(n) (first write verify operation) performed, but a write verify operation to verify whether or not the threshold voltage distribution EP or greater has been provided to the memory cells MC (n+1) and MC (n−1) adjacent to the memory cell MC (n) (second write verify operation) is also performed. Then, only when a positive judgment is made in both the first write verify operation and the second write verify operation, is the write operation on the memory cell MC(n) judged to have been completed. This is because, as shown in FIG. 8, even if the write operation providing the threshold voltage distributions EP, A, B, or C corresponding to write data in the memory cell MC(n) has been completed, there is a risk of data change occurring after a long period of time has passed, so long as the threshold voltage distribution E (distribution having at least a part that is negative) subsequent to the erase operation remains in the memory cells MC(n−1) and MC(n+1) adjacent to the memory cell MC(n).

Figure 10:
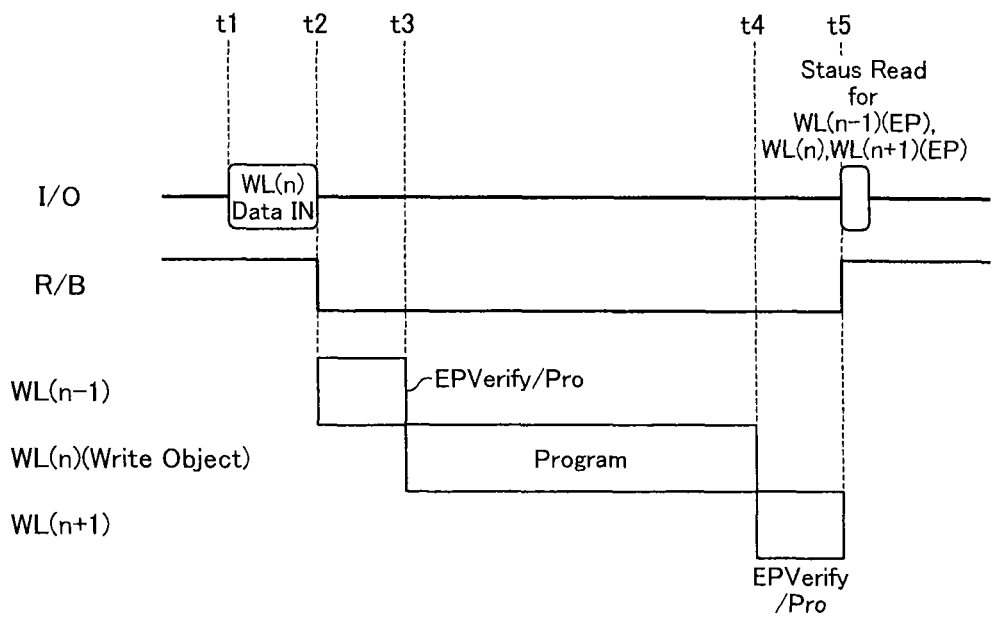
FIG. 10 is a timing chart showing a procedure of a write operation in the first embodiment.

Next, details of the write operation in the present embodiment are described with reference to the timing chart in FIG. 10. FIG. 10 shows an example where the memory cells MC(n) formed along the word line WL(n) are the write object, and the memory cells MC (n−1) and MC (n+1) adjacent to these memory cells MC(n) undergo execution of the EP distribution write operation and its write verify operation (EP distribution write verify operation). The write operation herein has write executed in increasing order of the word lines WL, that is, in the order of word lines WL0, WL1, WL2, .... FIG. 10 shows the input/output signal (I/O) to the input/output circuit 16 and the ready/busy signal (R/B) which indicates whether input/output of data and so on is possible or not.

In addition, the status register 18 includes three data registers SR0, SR1, and SR2. These three data registers SR0, SR1, and SR2 are provided to temporarily retain the result of the write verify operation in the memory cells MC(n) along the word line WL(n), and to temporarily retain the result of the EP distribution write verify operation in the memory cells MC(n−1) and MC(n+1) adjacent to these memory cells MC(n).

When performing write to the memory cells MC (n) along the word line WL(n), first, at time t1, address data, write data, and commands for the write operation to be provided to the memory cells MC(n) are inputted to the input/output circuit 16, and further inputted to the data circuit/page buffer 13.

Then, at time t2 (time when R/B becomes ready), the memory cells MC(n−1) formed along the word line WL(n−1) adjacent to the word line WL(n) undergo execution of the EP distribution write verify operation. If the memory cells MC (n−1) are judged not to have the threshold voltage distribution EP but to have a threshold voltage distribution lower than the threshold voltage distribution EP (such as the threshold voltage distribution E), then the word line WL(n−1) is subjected to execution of the EP distribution write operation.

On the other hand, if the memory cells MC(n−1) are judged by the EP distribution write verify operation to already have the threshold voltage distribution EP, a status signal S[WL (n−1)(EP)] indicating completion of the EP distribution write operation in the memory cells MC(n−1) is stored in the data register SR0.

Subsequently, the write operation on the memory cells MC(n) along the word line WL(n) is commenced at, for example, time t3, thereby writing into the memory cells MC (n) the write data downloaded into the page buffer 13 at time t1.

On the other hand, in the case that the memory cells MC(n−1) are judged by the EP distribution write verify operation to already have the threshold voltage distribution EP, the status signal S[WL(n−1) (EP)] indicating completion of the EP distribution write operation in the memory cells MC(n−1) is stored in the data register SR0. Then, the write operation on the memory cells MC(n) along the word line WL(n) is commenced at, for example, time t3, thereby writing into the memory cells MC(n) the write data downloaded into the page buffer 13 at time t1.

If it is judged by the write verify operation on the word line WL(n) that the write operation on the memory cells MC(n) along the word line WL(n) has been completed, a status signal S[WL(n)] indicating to the fact is stored in the data register SR1.

Subsequently, at time t4, the EP distribution write verify operation (EPverify) on the memory cells MC(n+1) along the word line WL(n+1) commences. If it is judged that the memory cells MC(n+1) have still not been provided with the threshold voltage distribution EP, the memory cells MC(n+1) undergo execution of the EP distribution write operation. If it is judged by the subsequent EP distribution write verify operation that the memory cells MC(n+1) have been provided with the threshold voltage distribution EP, a status signal S[WL(n+1) (EP)] indicating the fact is provided to the data register SR2.

Then, at time t5, read of the status signals retained in the status register 20 is performed. That is, the three status signals S[WL (n−1) (EP)], S[WL(n)], and S[WL(n+1) (EP)] retained in the three data registers SR0-SR2 in the status register 20 are outputted (notified) toward a controller not shown in the drawings. If all of these signals are "1", a judgment is made by the controller not shown that the write operation to the memory cells MC(n) along the word line WL(n) has been completed. The result of the judgment is stored as a PASS flag in said controller, for example.

Thus, in order for the write operation of the memory cells MC(n) along the single word line WL(n) to be judged completed, the present embodiment requires conditions that, in addition to the write verify operation of said memory cells MC(n) being completed, the EP distribution write operation on the memory cells MC(n−1) and MC(n+1) along the adjacent word lines WL(n−1) and WL(n+1) is also completed. This allows the problem of data change shown in FIG. 8 to be avoided, and reliability of data retained in the memory cells to be improved.

Note that in FIG. 10, the EP distribution write operation and EP distribution write verify operation on the memory cells MC(n+1) along the word line WL(n+1) adjacent to the word line WL(n+1) are performed after execution of the write operation on the memory cells MC(n) along the word line WL(n). However, similar advantages can be displayed even if this order is reversed.

[Second Embodiment]

Figure 11:
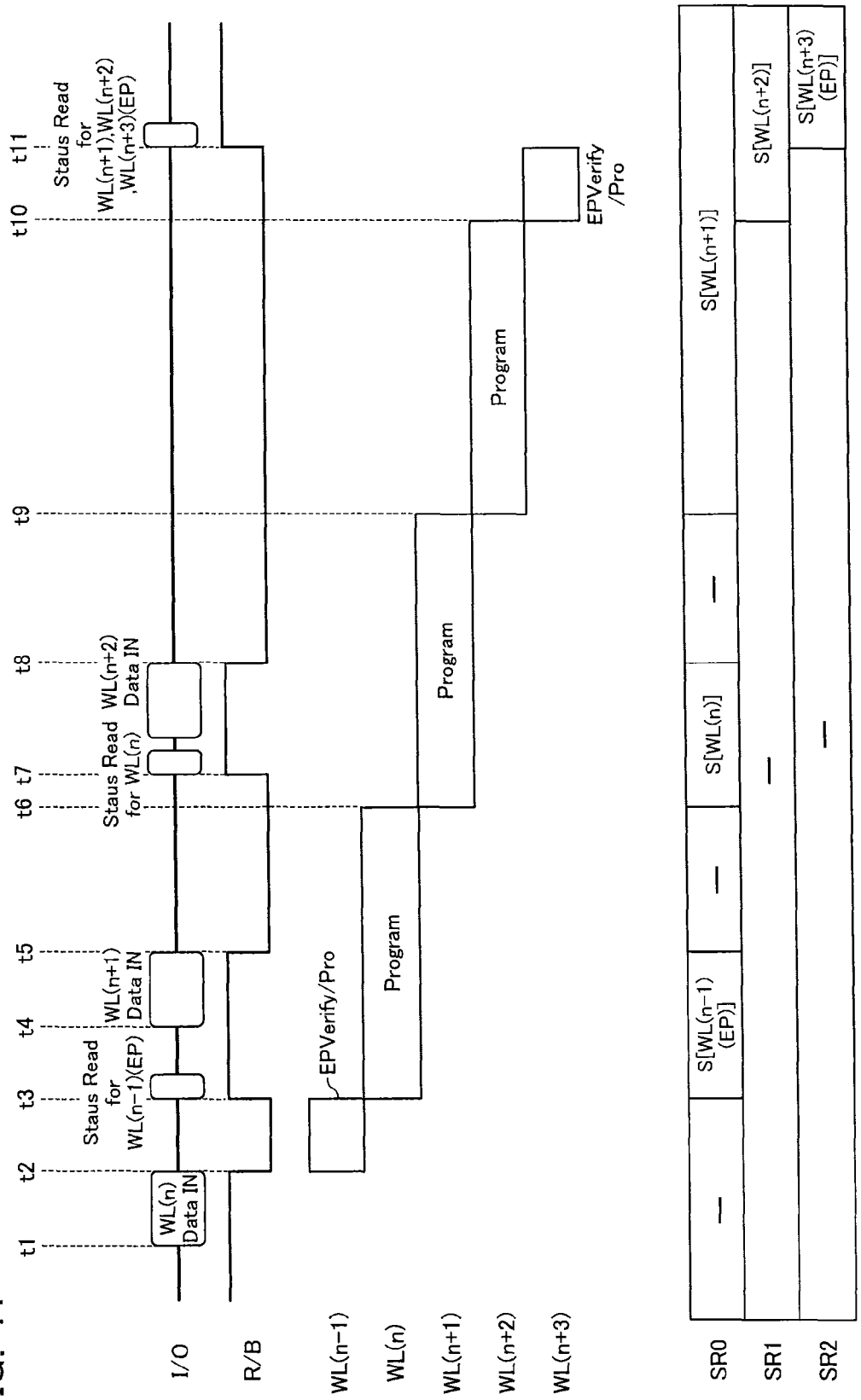
FIG. 11 is a timing chart showing a procedure of a write operation in a second embodiment.

Next, a nonvolatile semiconductor memory device according to a second embodiment is described with reference to FIG. 11. Overall configuration is similar to that shown in FIGS. 1-5. However, as shown in FIG. 11, a procedure of the write operation in this embodiment differs from that in the first embodiment. Note that a description of matters similar to those in FIG. 10 is omitted.

In this second embodiment, write operations having as write objects the memory cells MC(n), MC(n+1), and MC (n+2) formed along the three word lines WL(n), WL (n+1), and WL(n+2) are performed continuously. Therefore, an EP distribution write verify operation (and further EP distribution write operation if required) is executed on the memory cells MC(n−1) along the word line WL(n−1) adjacent to the word line WL(n) which is the first of the word lines WL(n)-WL(n+2) subject to continuous write write to be subject to write. The threshold voltage distribution EP being written to the memory cells MC(n−1) along the word line WL(n−1) prevents data change in the memory cells MC(n)-MC(n+2) from occurring.

Furthermore, an EP distribution write operation and EP distribution write verify operation are executed also on the memory cells MC(n+3) along the word line WL(n+3) adjacent to the word line WL(n+2) which is last subject to write. Moreover, judgment of whether the write operation of the continuously written word lines WL(n)-WL(n+2) has been completed or not is performed on the basis of whether the EP distribution write operation in the adjacent word lines WL(n−1) and WL(n+3) has been completed or not. The write operation in the present embodiment is described in detail below with reference to FIG. 11.

When performing the write operation continuously on the memory cells MC(n)-MC(n+2) along the word lines WL(n)-WL(n+2), first, at time t1, address data, write data, and commands of the write operation for the memory cells MC(n) (word line WL(n)) are inputted to the input/output circuit 16 (WL(n) Data IN).

Then, at time t2, the memory cells MC(n−1) formed along the word line WL(n−1) adjacent to the word line WL(n) undergo execution of the EP distribution write verify operation, similarly to in the first embodiment. The EP distribution write verify operation is executed on the memory cells MC (n−1) adjacent to the memory cells MC(n), prior to the write operation on the memory cells MC(n). As a result, if the memory cells MC(n−1) are judged to have a threshold voltage distribution lower than the threshold voltage distribution EP (such as the threshold voltage distribution E), then the word line WL(n−1) is subjected to execution of the EP distribution write operation.

On the other hand, if the memory cells MC(n−1) are judged to already have the threshold voltage distribution EP, a status signal S[WL(n−1) (EP)] indicating completion of the EP distribution write operation in the memory cells MC(n−1) is stored in the data register SR0.

Subsequently, at time t3, read of the status register 20 is executed and the aforementioned status signal S[WL(n−1) (EP)] is outputted toward an external controller not shown in the drawings. The external controller stores this status signal S[WL(n−1) (EP)] in a certain place.

Simultaneously to this, at time t3, the write operation (program) and, in addition, the write verify operation on the memory cells MC (n) formed along the word line WL(n) are commenced.

Then, in parallel with the write operation on the word line WL(n), at time t4, an address, write data, and commands of the write operation for the memory cells MC(n+1) formed along the next word line WL(n+1) are inputted to the input/output circuit 16 (WL(n+1) Data IN). At time t5, when input of this write data is finished, the ready/busy signal R/B becomes "L".

If it is judged by the write verify operation at for example time t6 that the write operation on the memory cells MC(n) along the word line WL(n) has been completed, a status signal S[WL(n)] indicating the fact is stored in the data register SR1. This results in the write operation on the memory cells MC(n) being completed at time t6. Then, the write operation (write pulse application operation and write verify operation) on the memory cells MC(n+1) along the word line WL(n+1) is commenced in accordance with the write data downloaded at time t4.

Subsequently, at time t7, when the ready/busy signal R/B returns to "H", a read command of the status register (Status Read for WL(n)) is generated, whereby the aforementioned status signal S[WL(n)] is read from the status register 20 and supplied to the external controller.

Following this, an address, write data, and commands of the write operation for the memory cells MC(n+2) along the word line WL(n+2) are inputted to the input/output circuit 16 (WL(n+2) Data IN). Now, the commands of the write operation on the memory cells MC(n+2) differ from the commands of the write operation on the memory cells MC(n) and MC(n+1) in that data indicating that data write to the memory cells MC(n+3) is not continuously performed.

Subsequently, the ready/busy signal R/B returns to "L", but the write operation on the word line WL(n+1) is repeated until completion of the write is detected by the write verify operation. When completion of the write operation of the memory cells MC(n+1) along the word line WL(n+1) is detected by the write verify operation at for example time t9, then the write operation of the memory cells MC(n+2) along the word line WL(n+2) is commenced in a continuous manner at the time t9 or at a later time. When completion of the write operation of the memory cells MC(n+2) along the word line WL(n+2) is detected by the write verify operation at for example time t10, then all the write operations subject to continuous write are completed.

However, subsequently, at time t10 or at a later time, an EP distribution write operation and EP distribution write verify operation on the memory cells MC(n+3) along the word line WL(n+3) are commenced to prevent data change of the memory cells MC(n+2). If it is detected by this EP distribution write verify operation that write to the memory cells MC(n+3) is completed to the threshold voltage distribution EP, then a status signal S[WL(n+3) (EP)]="1" indicating the fact is stored in the status register SR2. The three status signals S[WL(n+1) (EP)], S[WL(n+2)], and S[WL(n+3) (EP)] retained in the three data registers SR0-SR2 in the status register 20 are outputted toward a controller not shown in the drawings. If all of these status signals are "1", a judgment is made by the controller not shown that the write operation to the memory cells MC(n) along the word line WL(n) has been completed. The result of the judgment is stored as a PASS flag in said controller, for example.

Thus, in order for the write operation of the memory cells MC(n)-MC(n+2) to be judged completed, the present embodiment requires conditions that, in addition to the write verify operation of said memory cells MC(n)-MC(n+2) being completed, the EP distribution write operation on the memory cells MC(n−1) and MC(n+3) along the adjacent word lines WL (n−1) and WL(n+3) is (also) completed. This allows the problem of data change of the kind shown in FIG. 8 to be avoided, and reliability of data retained in the memory cells to be improved. Moreover, a continuous write is performed on the memory cells MC(n)-MC(n+2) in this embodiment. Accordingly, in the write operation of the memory cells MC(n+1) and MC(n+2), the EP distribution write operation on the memory cells MC(n) and MC (n+1) next to the memory cells MC (n+1) and MC (n+2) on the source line CELSRC side can be omitted. Therefore, time required for the write operation can be proportionately reduced.

[Third Embodiment]

Figure 12:
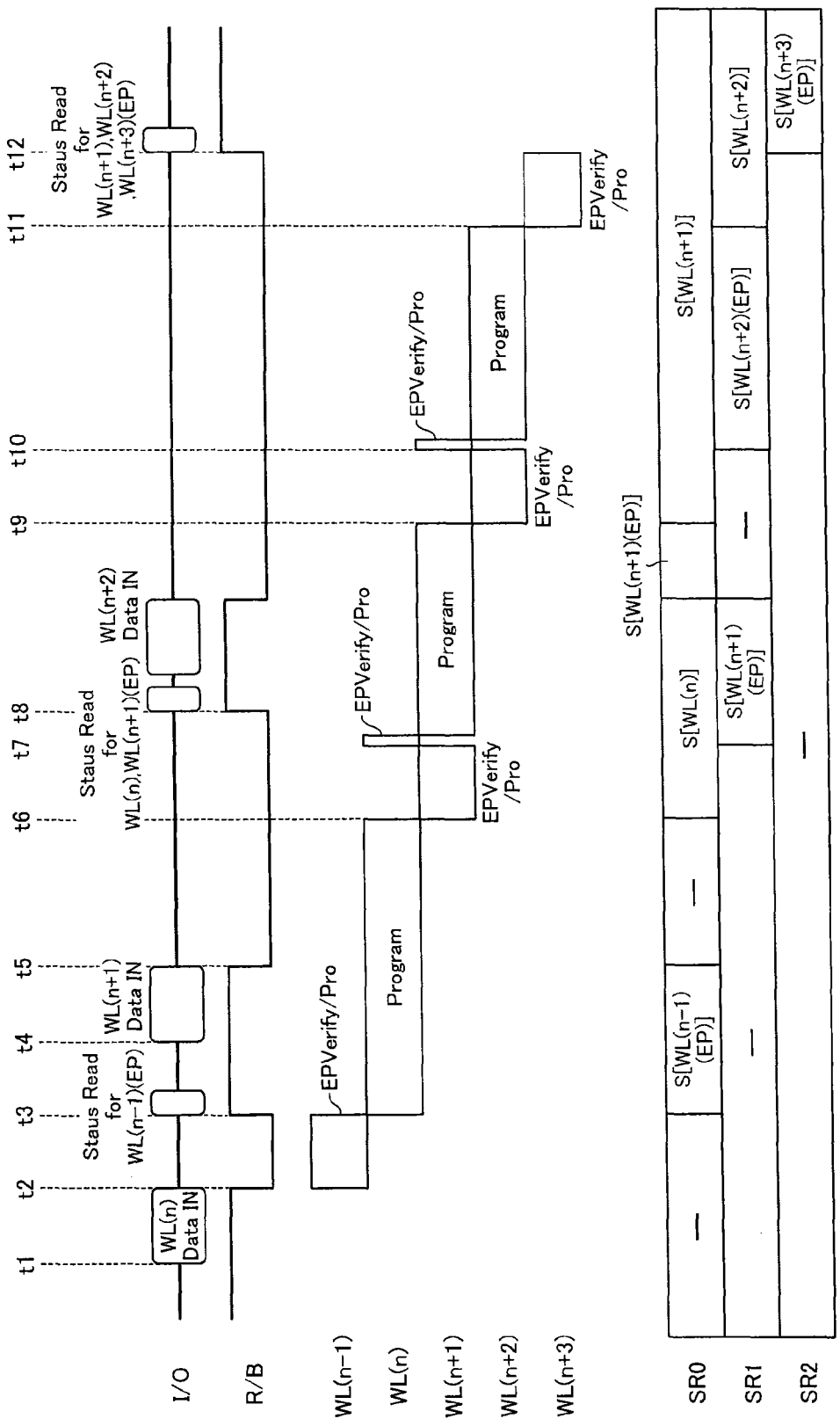
FIG. 12 is a timing chart showing a procedure of a write operation in a third embodiment.

Next, a nonvolatile semiconductor memory device according to a third embodiment is described with reference to FIG. 12. Overall configuration is similar to that shown in FIGS. 1-5. However, this embodiment also adopts a write scheme that selects the memory cells MC(n), MC(n+1), and MC(n+2) formed along the three word lines WL(n), WL(n+1), and WL (n+2), as write objects, and perform continuous writing to these memory cells, similarly to the second embodiment. Moreover, this embodiment is also similar to the second embodiment in that the EP distribution write operation and EP distribution write verify operation are executed on the memory cells MC(n−1) and MC(n+3) along the word lines WL(n−1) and WL(n+3) adjacent to the word lines WL(n) and WL(n+2). Furthermore, this embodiment is also similar to the second embodiment in that judgment of whether the write operation of the continuously written word lines WL(n)-WL(n+2) has been completed or not is performed on the basis of whether the EP distribution write operation in the adjacent word lines WL(n−1) and WL(n+3) has been completed or not.

The write operation in the present embodiment is described below with reference to FIG. 12. The difference from the second embodiment is that, before commencing the write operation (program) in each of the word lines WL(n), an EP distribution write verify operation is also performed in the word line WL(n−1) selected immediately prior to the word line WL(n), and then, after the write operation in said word line WL(n) has been completed, the EP distribution write operation and EP distribution write verify operation are executed point by point also in the word line WL(n+1) selected immediately afterword line WL(n)).

That is, before the write operation to the memory cells MC(n) along the word line WL(n) commences at time t3, the EP distribution write operation and EP distribution write verify operation are executed on the memory cells MC(n−1) along the word line WL(n−1) at time t2. When the write operation to the memory cells MC(n) is completed at time t6, the EP distribution write operation and EP distribution write verify operation (EP Verify/Pro) are executed on the memory cells MC(n+1) along the word line WL(n+1) selected immediately after the word line WL(n).

In addition, before the write operation to the memory cells MC (n+1) along the word line WL (n+1) commences, the EP distribution write operation and EP distribution write verify operation are executed on the memory cells MC(n) along the word line WL(n) at time t7. Moreover, when the write operation to the memory cells MC(n+1) is completed at time t9, the EP distribution write operation and EP distribution write verify operation (EP Verify/Pro) are executed on the memory cells MC(n+2) along the word line WL(n+2) selected immediately after the word line WL(n+1). Operations are performed similarly also in the word line WL(n+2).

According to this embodiment whenever the write operation in each of the word lines WL(n) finishes, the EP distribution write operation and EP distribution write verify operation on the word line WL(n+1) adjacent to the word line WL (n) are always executed. This embodiment causes write conditions to be uniform on a word line basis, hence enables reliability of data retained in the memory cells to be even further improved.

[Fourth Embodiment]

Figure 13:
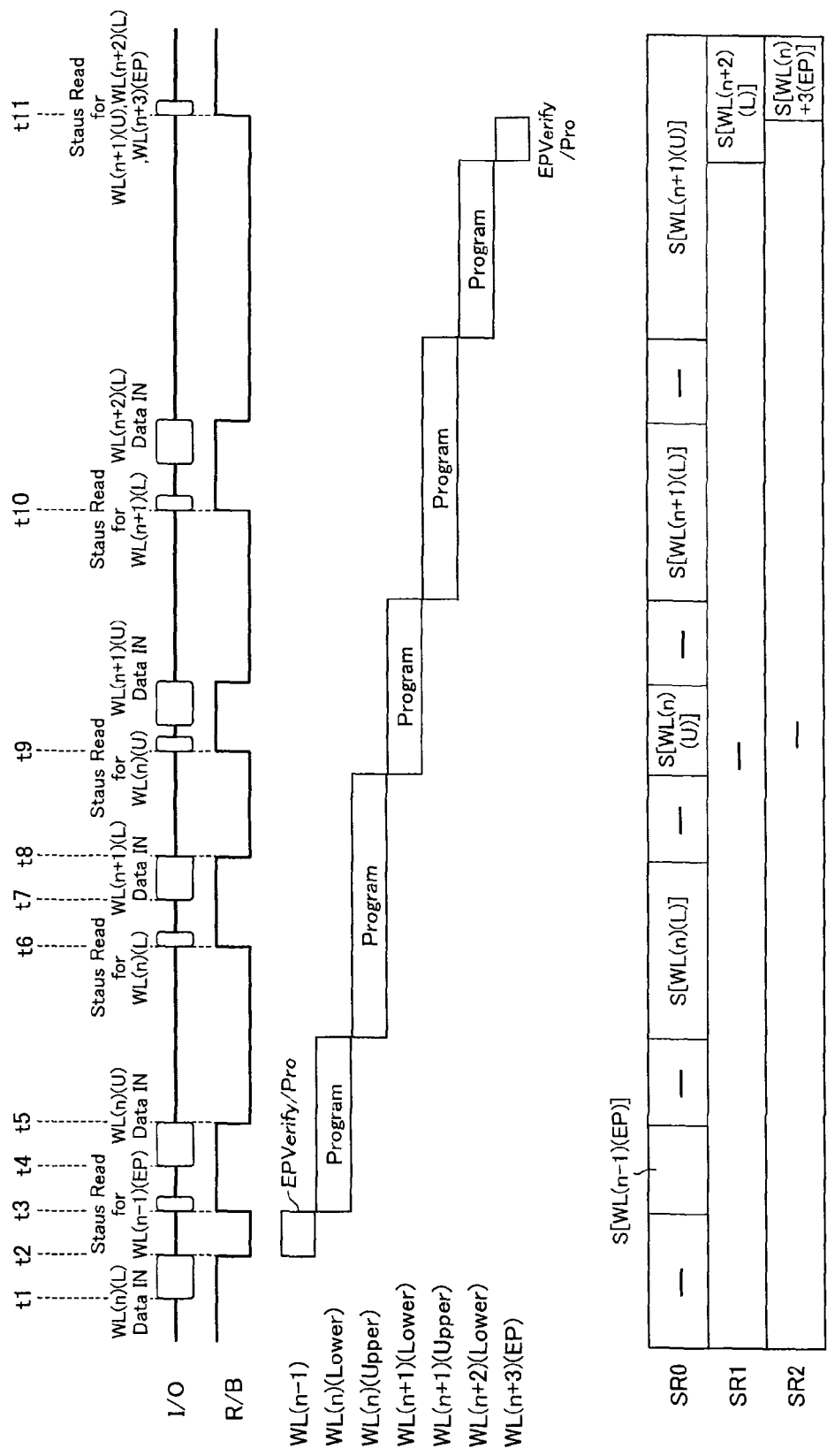
FIG. 13 is a timing chart showing a procedure of a write operation in a fourth embodiment.

Next, a nonvolatile semiconductor memory device according to a fourth embodiment is described with reference to FIG. 13. Overall configuration is similar to that shown in FIGS. 1-5. This embodiment adopts a write scheme that selects the memory cells MC(n), MC(n+1), and MC(n+2) formed along the three word lines WL(n), WL(n+1), and WL(n+2),as write objects, and perform continuous writing to these memory cells, similarly to the second embodiment.

This embodiment is described as adopting the two bits per cell write scheme where two bits of data are stored in one memory cell. In addition, this embodiment takes the form that the two bits of data are supplied divided into one bit of lower page data and one bit of upper page data, and that a lower page data write (Lower) and an upper page data write (Upper) are executed sequentially. Therefore, in the present embodiment, the following (1)-(5) are continuously executed:

(1) lower page data write to the word line WL(n);
(2) upper page data write to the word line WL(n);
(3) lower page data write to the word line WL(n+1);
(4) upper page data write to the word line WL(n+1); and
(5) lower page data write to the word line WL (n+2). Before and after these (1)-(5), the EP distribution write operation and EP distribution write verify operation are executed in the word lines WL(n−1) and WL(n+3) adjacent to the word lines WL(n)-WL(n+2). In other regards, the present embodiment is similar to the first embodiment. This embodiment causes write conditions per page along a word line to be uniform, hence enables reliability of data retained in the memory cells to be even further improved.

[Fifth Embodiment]

Figure 14:
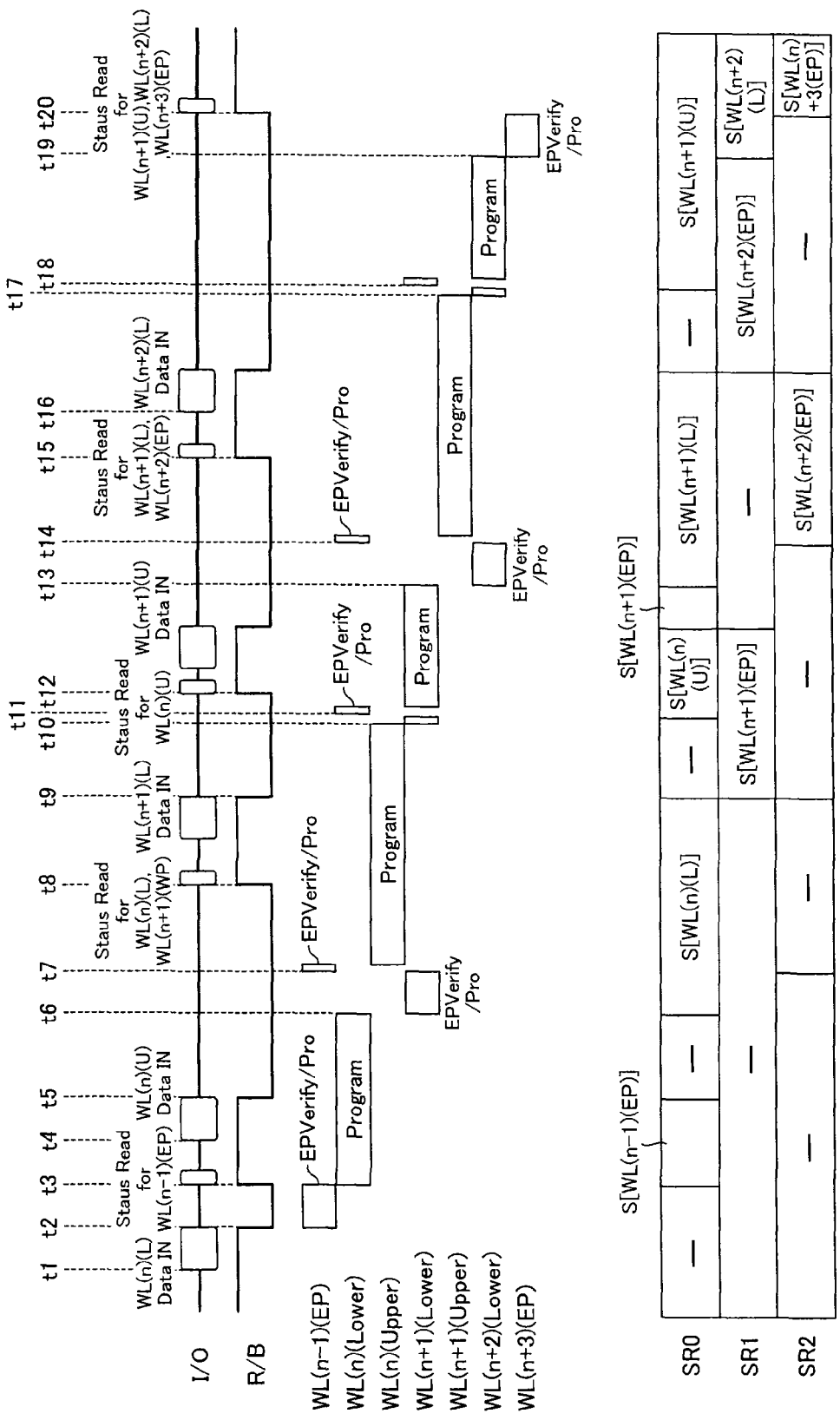
FIG. 14 is a timing chart showing a procedure of a write operation in a fifth embodiment.

Next, a nonvolatile semiconductor memory device according to a fifth embodiment is described with reference to FIG. 14. Overall configuration is similar to that shown in FIGS. 1-5. This embodiment selects as write objects the memory cells MC(n), MC(n+1), and MC(n+2) formed along the three word lines WL(n), WL(n+1), and WL(n+2), perform continuous write to these memory cells, and adopts the two bits per cell write scheme, similarly to the third embodiment. However, this embodiment is configured such that, before commencing the write operation (program) of the lower page data write or upper page data write in each of the word lines WL(n), an EP distribution write verify operation is also performed in the word line WL(n−1) selected immediately prior to the word line WL(n), and then, after the lower page data write or upper page data write operation in said word line WL(n) has been completed, the EP distribution write operation and EP distribution write verify operation are performed point by point also in the word line WL (n+1) selected immediately after the word line WL(n), similarly to the third embodiment. This embodiment causes write conditions per page along a word line to be uniform, hence enables reliability of data retained in the memory cells to be even further improved.

[Sixth Embodiment]

Figure 15:
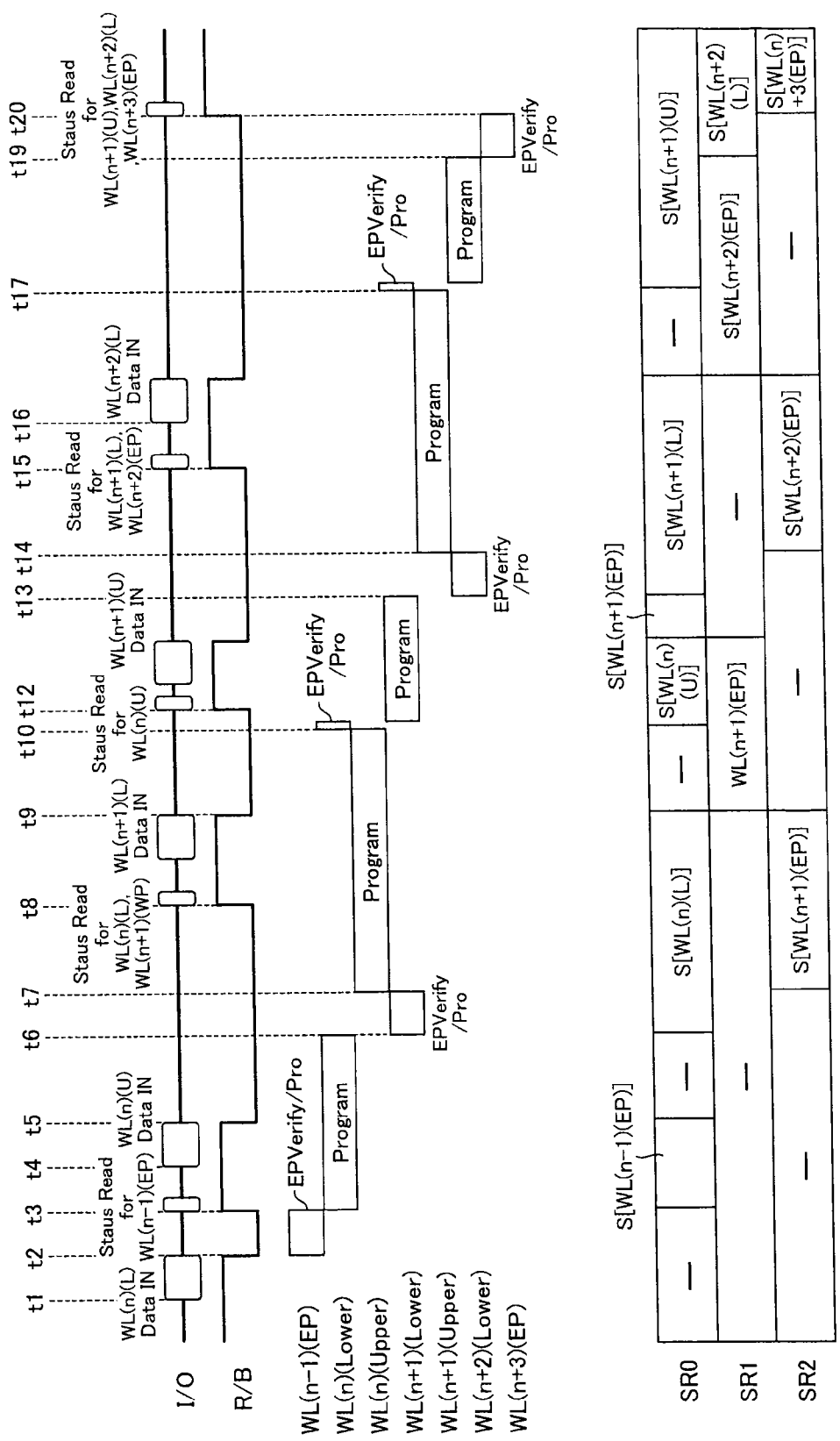
FIG. 15 is a timing chart showing a procedure of a write operation in a sixth embodiment.

Next, a nonvolatile semiconductor memory device according to a sixth embodiment is described with reference to FIG. 15. Overall configuration is similar to that shown in FIGS. 1-5. This embodiment is almost the same as the fifth embodiment. The fifth embodiment and the present embodiment differ in that, whereas in the fifth embodiment, before executing lower page data write or upper page data write in each of the word lines WL, point by point independent EP distribution write verify operations and EP distribution write operations are executed (EPVerify/Pro at times t3, t7, t11, t14, and t18 in FIG. 14), in the present embodiment, the EP distribution write verify operation prior to execution of upper page write in each of the word lines (times t7 and t14) is omitted. This is because, at a stage of lower page write of the memory cells MC(n) executed before upper page write of the memory cells MC(n), execution of the EP distribution write verify operation of the memory cells MC(n−1) adjacent to the memory cells MC(n) has already been completed. Hence there is no need to re-verify. Omitting an operation in this way allows advantages similar to those of the aforementioned embodiments to be displayed, and enables time required for the write operation to be reduced, thereby improving performance.

[Seventh Embodiment]

Figure 16:
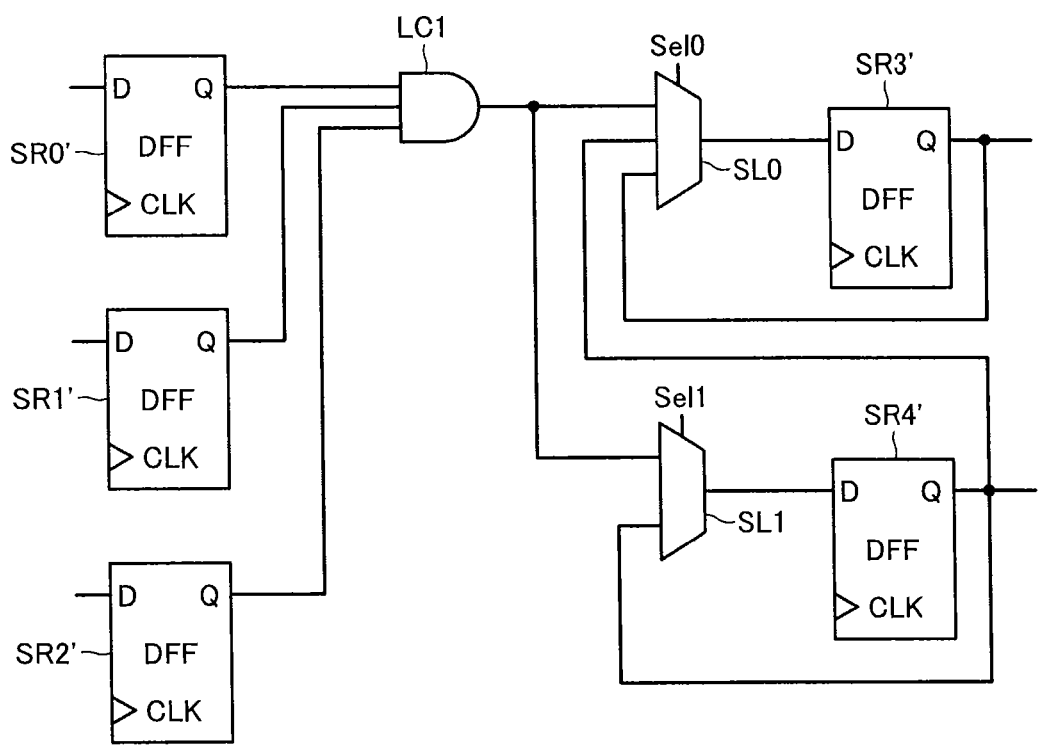
FIG. 16 is a circuit diagram showing a structure of a status register 20 employed in a nonvolatile semiconductor memory device in a seventh embodiment.
Figure 17:
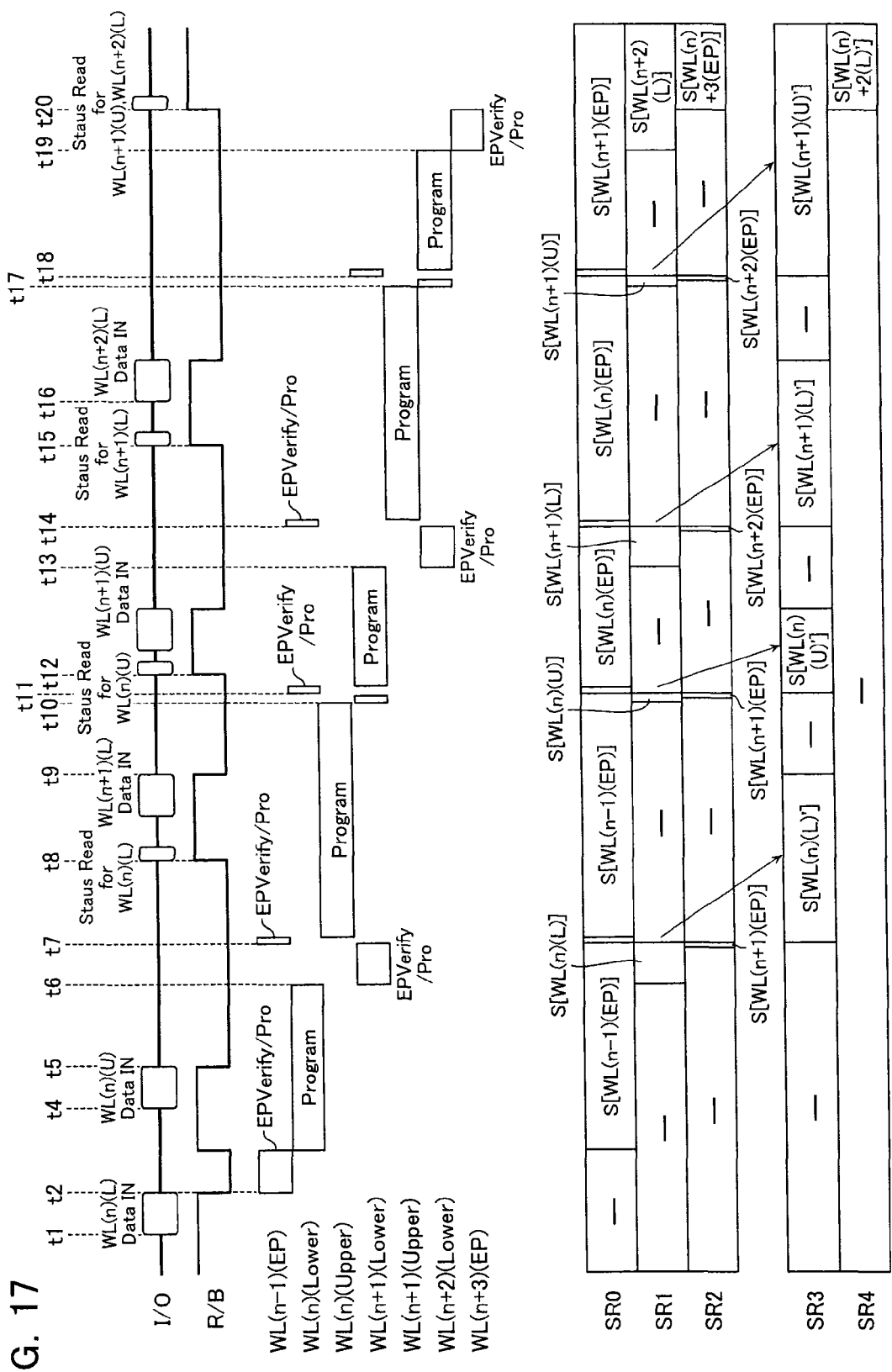
FIG. 17 is a timing chart showing a procedure of a write operation in the seventh embodiment.

Next, a nonvolatile semiconductor memory device according to a seventh embodiment is described with reference to FIGS. 16 and 17. Overall configuration is similar to that shown in FIGS. 1-5. FIG. 16 shows a specific structure of the status register 20 in the seventh embodiment. FIG. 17 is a timing chart showing a procedure of a write operation in the present embodiment.

This embodiment differs from the previously mentioned embodiments in having a status register 20 configured as shown in FIG. 16, and hence being configured capable of judging whether the write operation in the memory cells MC(n) along each of the word lines WL(n) has been completed or not memory-chip-internally (in a memory-chip-internal manner), rather than by an external controller.

The structure of the status register 20 in the present embodiment is described with reference to FIG. 16. This status register 20 includes five data registers SR0'-SR4'. The data register SR0' is a register for retaining a status signal related to a memory cell subject to a write operation earlier than the memory cell currently supplied with write data and in the process of undergoing a write operation. The data register SR1' is a register for retaining a status signal related to the memory cell currently supplied with write data and in the process of undergoing a write operation. The data register SR2' is a register for retaining a status signal related to a memory cell subject to a write operation later than the memory cell currently supplied with write data and in the process of undergoing a write operation. The data registers SR3' and SR4' are provided to retain logical operation results of retained data of the data registers SR0'-SR2'.

An AND gate LC1 is provided as a circuit for performing a logical AND operation of retained data of the data registers SR0'-SR2'. An output signal of the AND gate LC1 is supplied to select circuits SL0 and SL1.

The select circuit SL0 is configured capable of selectively outputting one of the output signal of the AND gate LC1, retained data of the data register SR3', or retained data of the data register SR4'. Moreover, the select circuit SL1 is also configured capable of selectively outputting one of the output signal of the AND gate LC1, or retained data of the data register SR4'.

A write operation of the present embodiment is described with reference to FIG. 17. This embodiment selects as write objects the memory cells MC(n), MC(n+1), and MC(n+2) formed along the three word lines WL(n), WL(n+1), and WL(n+2), perform continuous write to these memory cells, and adopts the two bits per cell write scheme, similarly to the third embodiment.

Specifically, first, at time t1, an address, lower page data to be written, and commands for the memory cells MC(n) along the word line WL(n) are supplied to the input/output circuit 16 (WL(n)(L)DataIN). Subsequently, at time t2, the ready/busy signal R/B becomes "L", and, while it is at "L", the EP distribution write verify operation and EP distribution write operation are executed on the memory cells MC(n−1) along the word line WL(n−1). If it is judged from the result of the EP distribution write verify operation that the EP distribution write operation in the memory cells MC(n−1) has been completed, a status signal S[WL(n−1) (EP)]="1" indicating the fact is stored in the data register SR0' of the status register 20.

Then, the ready/busy signal R/B returns to "H", and lower page data write to the memory cells MC(n) along the word line WL(n) is commenced. In parallel with progress of this lower page data write to the memory cells MC(n), an address, upper page data (U) to be written, and write commands for the memory cells MC(n) are inputted to the input/output circuit 16 at time t4 or at a later time (WL(n) (U)DataIN).

At time t5, when input of upper page data (U) finishes, the ready/busy signal R/B returns again to "L". Subsequently, when it is detected at for example time t6 that the lower page write operation on the memory cells MC(n) (word line WL(n)) has been completed, a status signal S[WL(n) (L)] indicating the fact is stored in the data register SR1'.

When lower page data write to the memory cells MC(n) finishes at time t6, the EP distribution write operation and EP distribution write verify operation on the memory cells MC(n+1) formed along the word line WL(n+1) adjacent to the word line WL(n) are sequentially executed. As a result, if it is judged that write of the memory cells MC(n+1) to the threshold voltage distribution EP has been completed, a status signal S[WL (n+1) (EP)] indicating the fact is stored in the data register SR2'.

In such a way, when the status signals S[WL (n−1) (EP)], S[WL(n)(L)], and S[WL(n+1) (EP)] stored in the data registers SR0'-SR2' all become "1", a status signal S[WLn(L)'] which is the output signal of the AND gate LC1 becomes "1" and is outputted. Then, a select signal SEL0 of the select circuit SL0 becomes "00" from for example time t7, whereby the status signal S[WLn(L)'] is retained in the data register SR3'. As a result, the status signal S[WL(n)(L)'] becomes "1", indicating that lower page data write to the memory cells MC(n) (word line WL(n)) has been completed.

Note that at time t8, a read command of the status register 20 is generated, causing this status signal S[WLn(L)'] to be outputted to the external controller (not illustrated).

Next, processing for upper page data write to the memory cells MC(n) along the word line WL(n) is commenced at time t7. At time t7, before commencing the write operation on the memory cells MC(n) along the word line WL(n), the EP distribution write verify operation and EP distribution write operation are executed on the memory cells MC(n−1) along the word line WL(n−1). If it is judged by this EP distribution write verify operation that the write operation of the memory cells MC(n−1) to the threshold voltage distribution EP has been completed, a status signal S[WL(n−1) (EP)]="1" indicating the fact is stored in the data register SR0'.

When the EP distribution write verify operation on the memory cells MC(n−1) finishes, upper page data write to the memory cells MC(n) along the word line WL(n) is commenced. Then, in parallel with progress of this upper page data write to the memory cells MC(n), a command instructing to read the previously mentioned status signal S[WL(n) (L)'] from the status register 20 is inputted to the input/output circuit 16 at time t8. The status register 20 receives this command and outputs the status signal S[WL(n) (L)'] toward the external controller not illustrated.

Then, lower page data (L) to be written to the memory cells MC(n+1) is inputted to the input/output circuit 16. The ready/busy signal R/B returns again to "L" at time t9.

Subsequently, when it is detected at for example time t10 that the upper page write operation on the memory cells MC(n) (word line WL(n)) has been completed, a status signal S[WL(n)(U)] indicating the fact is stored in the data register SR1'.

When upper page data write to the memory cells MC(n) (word line WL(n)) finishes at time t10, the EP distribution write operation and EP distribution write verify operation on the memory cells MC(n+1) formed along the word line WL(n+1) adjacent to the word line WL(n) are sequentially executed. As a result, if it is judged that write of the memory cells MC(n+1) to the threshold voltage distribution EP has been completed, a status signal S[WL(n+1) (EP)] indicating the fact is stored in the data register SR2'.

In such a way, when the status signals S[WL(n−1) (EP)], S[WL(n) (U)], and S[WL(n+1) (EP)] stored in the data registers SR0'-SR2' all become "1", a status signal S[WLn(U)'] which is the output signal of the AND gate LC1 becomes "1" and is outputted. Then, a select signal SEL0 of the select circuit SL0 becomes "00" from for example time t12, whereby the status signal S[WLn(U)'] is retained in the data register SR3'. As a result, the status signal S[WL(n)(U)'] becomes "1", indicating that upper page data write to the memory cells MC(n) (word line WL(n)) has been completed.

Note that at time t12, a read command of the status register 20 is generated, causing this status signal S[WLn(U)'] to be outputted to the external controller (not illustrated).

Next, processing for lower page data write to the memory cells MC(n+1) along the word line WL(n+1) is commenced at time t11. At time t11, before commencing the lower page write operation on the memory cells MC (n+1) along the word line WL(n+1), the EP distribution write verify operation and EP distribution write operation are executed on the memory cells MC(n) along the word line WL(n) neighboring the word line WL(n+1). If it is judged by this EP distribution write verify operation that the write operation of the memory cells MC(n) to the threshold voltage distribution EP has been completed, a status signal S[WL(n) (EP)]="1" indicating the fact is stored in the data register SR0'.

When the EP distribution write verify operation on the memory cells MC(n) finishes, lower page data write to the memory cells MC(n+1) along the word line WL(n+1) is commenced. Then, in parallel with progress of this lower page data write to the memory cells MC(n+1), a command instructing to read the previously mentioned status signal S[WL(n) (U)'] from the status register 20 is inputted to the input/output circuit 16 at time t12. The status register 20 receives this command and outputs the status signal S[WL(n) (U)'] toward the external controller not illustrated.

Subsequently, upper page data (U) to be written to the memory cells MC (n+1) is inputted to the input/output circuit 16. Then, the ready/busy signal R/B returns again to "L".

Subsequently, when it is detected at for example time t13 that the lower page write operation on the memory cells MC(n+1) (word line WL(n+1)) has been completed, a status signal S[WL(n+1)(L)] indicating the fact is stored in the data register SR1'.

Following on from when lower page data write to the memory cells MC(n+1) (word line WL(n+1)) finishes at time t13, the EP distribution write operation and EP distribution write verify operation on the memory cells MC(n+2) formed along the word line WL(n+2) adjacent to the word line WL(n+1) are executed. As a result, if it is judged that write of the memory cells MC(n+2) to the threshold voltage distribution EP has been completed, a status signal S[WL(n+2) (EP)] indicating the fact is stored in the data register SR2'.

In such a way, when the status signals S[WL(n) (EP)], S[WL(n+1)(L)], and S[WL(n+2) (EP)] stored in the data registers SR0'-SR2' all become "1", a status signal S[WL(n+1)(L)'] becomes similarly to above, indicating that lower page data write to the memory cells MC(n+1) (word line WL(n+1)) has been completed.

At time t15, a read command of the status register 20 is generated, causing the status signal S[WLn+1(L)'] to be outputted to the external controller (not illustrated).

Next, processing for upper page data write to the memory cells MC(n+1) along the word line WL(n+1) is commenced at time t14. At time t14, before commencing the upper page write operation on the memory cells MC(n+1) along the word line WL(n+1), the EP distribution write verify operation and EP distribution write operation are executed on the memory cells MC(n) along the word line WL(n) neighboring the word line WL(n+1). If it is judged by this EP distribution write verify operation that the write operation of the memory cells MC(n) to the threshold voltage distribution EP has been completed, a status signal S[WL(n)(EP)]="1" indicating the fact is stored in the data register SR0'.

When the EP distribution write verify operation on the memory cells MC(n) finishes, upper page data write to the memory cells MC(n+1) along the word line WL(n+1) is commenced. Then, in parallel with progress of this upper page data write to the memory cells MC(n+1), a command instructing to read the previously mentioned status signal S[WL(n) (U)'] from the status register 20 is inputted to the input/output circuit 16 at time t15. The status register 20 receives this command and outputs the status signal S[WL(n) (U)'] toward the external controller not illustrated.

Subsequently, lower page data (U) to be written to the memory cells MC(n+2) is inputted to the input/output circuit 16. Then, the ready/busy signal R/B returns again to "L".

Furthermore, when it is detected at for example time t17 that the upper page write operation on the memory cells MC(n+1) (word line WL(n+1)) has been completed, a status signal S[WL(n+1) (U)] indicating the fact is stored in the data register SR1'.

When upper page data write to the memory cells MC (n+1) (word line WL(n+1)) finishes at time t17, the EP distribution write operation and EP distribution write verify operation on the memory cells MC (n+2) formed along the word line WL(n+2) adjacent to the word line WL(n+1) are sequentially executed. As a result, if it is judged that write of the memory cells MC(n+2) to the threshold voltage distribution EP has been completed, a status signal S[WL(n+2) (EP)] indicating the fact is stored in the data register SR2'.

In such a way, when the status signals S[WL(n)(EP)], S[WL(n+1)(U)], and S[WL(n+2)(EP)] stored in the data registers SR0'-SR2' all become "1", a status signal S[WL(n+1) (U)'] becomes "1" similarly to above, indicating that upper page data write to the memory cells MC(n+1) (word line WL(n+1)) has been completed.

At time t20, a read command of the status register 20 is generated, causing the status signal S[WLn+1(U)'] to be outputted to the external controller (not illustrated).

Next, processing for lower page data write to the memory cells MC(n+2) along the word line WL(n+2) is commenced at time t18. At time t18, before commencing the lower page write operation on the memory cells MC(n+2) along the word line WL(n+2), the EP distribution write verify operation and EP distribution write operation are executed on the memory cells MC(n+1) along the word line WL(n+1) neighboring the word line WL(n+2). If it is judged by this EP distribution write verify operation that the write operation of the memory cells MC(n+1) to the threshold voltage distribution EP has been completed, a status signal S[WL(n+1)(EP)]="1" indicating the fact is stored in the data register SR0'.

When the EP distribution write verify operation on the memory cells MC(n+1) finishes, lower page data write to the memory cells MC(n+2) along the word line WL(n+2) is commenced.

Furthermore, when it is detected at for example time t19 that the lower page write operation on the memory cells MC(n+2) (word line WL(n+2)) has been completed, a status signal S[WL(n+2) (L)] indicating the fact is stored in the data register SR1'.

Subsequently, at time t19, the EP distribution write operation and EP distribution write verify operation on the memory cells MC(n+3) formed along the word line WL(n+3) are executed. If it is judged by the EP distribution write verify operation that the EP distribution write operation on the memory cells MC (n+3) formed along the word line WL(n+3) has been completed, a status signal S[WL(n+3) (EP)] is stored in the data register SR2'.

Following on from when lower page data write to the memory cells MC(n+2) (word line WL(n+2)) finishes at time t19, the EP distribution write operation and EP distribution write verify operation on the memory cells MC(n+3) formed along the word line WL(n+3) adjacent to the word line WL(n+2) are executed. As a result, if it is judged that write of the memory cells MC(n+3) to the threshold voltage distribution EP has been completed, a status signal S[WL(n+3) (EP)] indicating the fact is stored in the data register SR2'.

In such a way, when the status signals S[WL(n+1) (EP)], S[WL(n+2)(L)], and S[WL(n+3) (EP)] stored in the data registers SR0'-SR2' all become "1", a status signal S[WL(n+2)(L)'] becomes "1" similarly to above, indicating that lower page data write to the memory cells MC(n+2) (word line WL(n+2)) has been completed.

A read command of the status register 20 is generated at a timing not illustrated, causing the status signal S[WL(n+2) (L)'] to be outputted to the external controller (not illustrated).

As described above, when the status signals S[WL(n) (L)'], S[WL(n) (U)'], S[WL(n+1) (L)'], S[WL(n+1) (U)'], and S[WL(n+2) (L)'] outputted to the external controller (not illustrated) are all "1", the write operation on the memory cells MC(n)-MC(n+2) along the word lines WL(n)-WL(n+2) is judged to have been completed.

In this way, the present embodiment allows judgment of whether the write operation on the memory cells MC(n) formed along the word line WL(n) has been completed or not to be performed memory-chip-internally (in a memory-chip-internal manner) without relying on an external controller.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above-mentioned embodiments, operation examples are described in the case of executing a two bits per cell write scheme. However, similar operation examples are clearly applicable also in the case of retaining multiple bits of three bits or more in one memory cell. Moreover, the above-mentioned embodiments are applicable also in the case of retaining one bit of data in one memory cell.

What is claimed is:

1. A nonvolatile semiconductor memory device, comprising:
  a plurality of memory cells;
  a plurality of word lines electrically connected to the memory cells, the word lines including a n-th word line, a (n−1)-th word line, and a (n+1)-th word line; and
  a control circuit configured to perform a first operation, a second operation, and a third operation when the nonvolatile semiconductor memory device receives a write command and a first address, the first address including a first page address, the first page address corresponding to the n-th word line,
  the control circuit being configured to perform the first operation for a memory cell electrically connected to the (n−1)-th word line, the first operation including a verify operation,
  the control circuit being configured to perform the second operation for a memory cell electrically connected to the n-th word line, the second operation including a write operation,
  the control circuit being configured to perform the third operation for a memory cell electrically connected to the (n+1)-th word line, the third operation including a verify operation.

2. The nonvolatile semiconductor memory device according to claim 1, wherein the nonvolatile semiconductor memory device is configured to receive a status read command during performing the second operation.

3. The nonvolatile semiconductor memory device according to claim 1, wherein the nonvolatile semiconductor memory device is configured to receive the write command and a second address, the second address including a second page address, the second page address corresponding to the (n+1)-th word line during performing the second operation.

4. The nonvolatile semiconductor memory device according to claim 2, wherein the nonvolatile semiconductor memory device is configured to output a status data during performing the second operation.

5. The nonvolatile semiconductor memory device according to claim 3, wherein the control circuit is configured to perform a fourth operation for the memory cell electrically connected to the (n+1)-th word line, the fourth operation including a write operation, the control circuit being configured to perform the fourth operation after the second operation without the third operation.

6. The nonvolatile semiconductor memory device according to claim 3, wherein the control circuit is configured to perform a fourth operation for the memory cell electrically connected to the (n+1)-th word line, the fourth operation including a write operation, the control circuit being configured to perform the fourth operation after the third operation.

7. The nonvolatile semiconductor memory device according to claim 6, wherein the control circuit is configured to perform a fifth operation for the memory cell electrically connected to the n-th word line, the fifth operation including a verify operation, the control circuit being configured to perform the fifth operation after the third operation and before the fourth operation.

8. The nonvolatile semiconductor memory device according to claim 1, wherein the control circuit is configured to execute the first operation continuously on a plurality of first memory cells that are adjacent to one another, and to execute the second operation on second memory cells adjacent to the plurality of first memory cells.

9. The nonvolatile semiconductor memory device according to claim 8, wherein the second operation is omitted in the first memory cells.

10. A nonvolatile semiconductor memory device, comprising:
a plurality of memory cells;
a plurality of word lines electrically connected to the memory cells, the word lines including a n-th word line, a (n−1)-th word line, and a (n+1)-th word line; and
a control circuit configured to perform a first operation, a second operation, and a third operation when the nonvolatile semiconductor memory device receives a write command and a first address, the first address including a first page address, the first page address corresponding to the n-th word line,
the control circuit being configured to perform the first operation for a memory cell electrically connected to the (n−1)-th word line, the first operation including a verify operation,
the control circuit being configured to perform the second operation for a memory cell electrically connected to the n-th word line, the second operation including a write operation,
the control circuit being configured to perform the third operation for a memory cell electrically connected to the (n+1)-th word line, the third operation including a verify operation,
the control circuit being configured to perform a fourth operation when the nonvolatile semiconductor memory device receives a write command and a second address, the second address including a second page address, the second page address corresponding to the n-th word line, the first page being different from the second page, the control circuit being configured to perform the fourth operation for the memory cell electrically connected to the n-th word line, the fourth operation including a write operation.

11. The nonvolatile semiconductor memory device according to claim 10, wherein the nonvolatile semiconductor memory device is configured to receive a status read command during performing the second operation.

12. The nonvolatile semiconductor memory device according to claim 11, wherein the nonvolatile semiconductor memory device is configured to output a status data during performing the second operation.

13. The nonvolatile semiconductor memory device according to claim 10, wherein the control circuit is configured to execute the first operation continuously on a plurality of first memory cells that are adjacent to one another, and execute the second operation on second memory cells adjacent to the plurality of first memory cells.

14. The nonvolatile semiconductor memory device according to claim 13, wherein the second operation is omitted in the first memory cells.

* * * * *